United States Patent
Teraguchi

(10) Patent No.: US 6,201,265 B1
(45) Date of Patent: Mar. 13, 2001

(54) GROUP III-V TYPE NITRIDE COMPOUND SEMICONDUCTOR DEVICE AND METHOD OF MANUFACTURING THE SAME

(75) Inventor: Nobuaki Teraguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/046,725

(22) Filed: Mar. 24, 1998

(30) Foreign Application Priority Data

Mar. 25, 1997 (JP) .................................................. 9-071018

(51) Int. Cl.$^7$ .................................................. H01L 33/00
(52) U.S. Cl. .............................................. 257/99; 257/773
(58) Field of Search ................................ 257/99, 98, 91, 257/81, 621, 774, 773

(56) References Cited

U.S. PATENT DOCUMENTS

| | | | |
|---|---|---|---|
| 4,445,132 | * 4/1984 | Ichikawa et al. | 357/32 |
| 4,447,822 | * 5/1984 | Chin et al. | 357/17 |
| 4,553,154 | * 11/1985 | Tsujii | 357/71 |
| 4,875,088 | * 10/1989 | Egawa et al. | 357/67 |
| 5,181,220 | * 1/1993 | Yagi | 257/98 |
| 5,281,830 | * 1/1994 | Kotaki et al. | 257/86 |
| 5,483,105 | * 1/1996 | Kaja et al. | 257/779 |
| 5,554,877 | * 9/1996 | Kitagawa et al. | 257/474 |
| 5,571,391 | * 11/1996 | Teraguchi | 204/290 R |
| 5,587,609 | * 12/1996 | Murakami et al. | 257/99 |
| 5,652,438 | * 7/1997 | Sassa et al. | 257/99 |
| 5,701,035 | * 12/1997 | Teraguchi | 257/747 |
| 5,798,537 | * 8/1998 | Nitta | 257/99 |
| 5,862,167 | * 1/1999 | Sassa et al. | 372/45 |
| 5,864,171 | * 1/1999 | Yamamoto et al. | 257/628 |
| 5,905,275 | * 5/1999 | Nunoue et al. | 257/95 |

FOREIGN PATENT DOCUMENTS

| | | | |
|---|---|---|---|
| 401280368 | * 11/1989 | (JP) | 257/99 |
| 9-237938 | * 9/1997 | (JP) . | |

OTHER PUBLICATIONS

Mohney et al., "Metallurgical Study of Contacts to Gallium Nitride," Gallium Nitride and Related Materials, Materials Research Society Symposium Proceedings, vol. 395, pp. 843–848, Dec. 1995.*

* cited by examiner

Primary Examiner—Jerome Jackson, Jr.
Assistant Examiner—B. W. Baumeister
(74) Attorney, Agent, or Firm—Morrison & Foerster, LLP

(57) ABSTRACT

A group III–V type nitride compound semiconductor device with superior characteristics and a method of readily manufacturing the same are provided. The group III–V type nitride compound semiconductor device has a metal nitride layer, an n-type contact layer, an n-type clad layer, a light emitting layer, a p-type clad layer and a p-type contact layer successively formed on an insulating substrate which has an opening in which an n-type electrode 8a is formed in contact with the metal nitride layer. A p-type electrode 9 is formed on the p-type contact layer 7. The area of the electrode closer to the substrate can be increased without degrading the mechanical strength of the substrate, and the operating voltage of the semiconductor device can thus be reduced.

11 Claims, 28 Drawing Sheets

GROUP III-V TYPE NITRIDE COMPOUND SEMICONDUCTOR DEVICE AND METHOD OF MANUFACTURING THE SAME

BACKGROUND OF THE INVENTION

1. Field of the Invention

The present invention relates to a group III–V type nitride compound semiconductor device and a method of manufacturing the same, and in particular to a group III–V type nitride compound semiconductor device which has a characteristic in its electrode structure and a method of manufacturing the same.

2. Description of the Background Art

Group III–V type nitride compound semiconductor devices have been conventionally fabricated by using sapphire and spinel as the substrate material. It is also necessary to form a cavity by cleaving in fabricating semiconductor devices, particularly semiconductor lasers. This requires use of a substrate material which has cleavage. However, neither sapphire nor spinel have cleavage. Accordingly, semiconductor lasers are fabricated by using an oxide material, such as $LiAlO_2$, $LiGaO_2$, as substrate material.

Such a substrate material as sapphire, spinel, $LiAlO_2$, $LiGaO_2$ and the like are, however, insulators. Accordingly, in forming an electrode in a proximity of a substrate (i.e., a lower electrode), various techniques are required as described below.

As one example of technique for forming an electrode in a proximity of a substrate, Japanese Patent Laying-Open No. 8-17803 discloses that a grown film of a group III–V type nitride compound semiconductor is partially removed by dry etching or the like to form an electrode in a proximity of a substrate.

FIG. 34 is a perspective view of a light-emitting diode device as one example of a conventional group III–V type nitride compound semiconductor device, with application of the technique of etching a grown film to form an electrode in a proximity of a substrate.

Referring to FIG. 34, the light-emitting diode device has an n-type contact layer 3, an n-type clad layer 4, a light-emitting layer 5, a p-type clad layer 6 and a p-type contact layer 7 successively deposited on an insulating substrate 1, and also has a p-type electrode 9 formed on the deposited layers. The grown film is partially etched away through to a portion of n-type contact layer 3 and an n-type electrode 68 is formed thereon.

FIG. 35 is a perspective view of a laser diode device as another example of conventional group III–V type nitride compound semiconductor devices, with application of the technique of etching a grown film to form an electrode in a proximity of a substrate.

The laser diode device shown in FIG. 35 has n-type contact layer 3, n-type clad layer 4, an active layer 35 with a quantum well structure, p-type clad layer 6 and p-type contact layer 7 successively deposited on insulating substrate 1, and also has p-type electrode 9 formed on the deposited layers. The grown film is partially etched away through to a portion of n-type contact layer 3, and an n-type electrode 78 is formed thereon.

FIG. 36 schematically shows a flow of current when current flows in a conventional semiconductor device in such a structure.

The semiconductor device shown in FIG. 36 has substrate 1, n-type contact layer 3, n-type clad layer 4, an active layer 5, p-type clad layer 6, p-type contact layer 7, an n-type electrode 88 and p-type electrode 9. As shown in FIG. 36, the flow of current in the conventional semiconductor device thus structured is biased to n-type electrode 88. Accordingly, when the device is particularly applied as a light emitting device, the luminous efficiency is degraded. The semiconductor device shown in FIG. 36 also has two electrodes 88 and 9 at a same side with respect to substrate 1 and thus the chip size is disadvantageously increased.

As another example of the technique of forming an electrode in a proximity of a substrate, Japanese Patent Laying-Open No. 7-221347 discloses that a substrate is partially removed to expose a surface of a gallium nitride based compound semiconductor layer and an electrode closer to the substrate is formed on the exposed, gallium nitride based compound semiconductor layer.

FIG. 37 is a cross section of a light emitting diode device as still another example of conventional group III–V type nitride compound semiconductor devices, with application of the technique of partially removing a substrate to expose a gallium nitride based compound semiconductor layer and forming an electrode in a proximity of the substrate on the exposed semiconductor layer.

The light emitting diode device shown in FIG. 37 has an n-type gallium nitride based compound semiconductor layer 94 and a p-type gallium nitride based compound semiconductor layer 96 successively deposited on sapphire substrate 1, and also has a positive electrode 99 on the deposited layers. Sapphire substrate 1 is partially removed so that the removal reaches n-type gallium nitride based compound semiconductor layer 94, to expose n-type gallium nitride based compound semiconductor layer 94. A negative electrode 98 is formed in contact with the exposed n-type gallium nitride based compound semiconductor layer 94.

A semiconductor device thus structured can solve the disadvantageous increase in chip size as with application of the technique disclosed in Japanese Patent Laying-Open No. 8-17803.

For the technique of partially etching a substrate away to form an electrode, however, the electrode closer to the substrate has a reduced area. Accordingly, current is not uniformly injected into the light emitting layer. While the area of the portion to be etched away can be increased to increase the area of the electrode, the mechanical strength of the substrate material is practically degraded and thus the area of the electrode closer to the substrate cannot be so increased. As a result, the operating voltage of the semiconductor device is disadvantageously increased.

SUMMARY OF THE INVENTION

One object of the present invention is to solve the aforementioned disadvantages and provide a group III–V type nitride compound semiconductor device superior in characteristics and a method of simply manufacturing the same.

A group III–V type nitride compound semiconductor device in one aspect of the present invention has an insulating substrate, a metal nitride layer of a conductivity formed on a first surface of the insulating substrate, and a group III–V type nitride compound semiconductor layer formed on the metal nitride layer. The insulating substrate has an opening at a portion thereof, and also has a first electrode formed in contact with the metal nitride layer at the opening, and a second electrode formed on the group III–V type nitride compound semiconductor layer.

In one aspect of the present invention, the metal nitride layer preferably consists of any of nitrides of any element which belongs to the groups 3A, 4A, 5A and 6A in the periodic table.

More specifically, the metal nitride layer contains at least one material selected from the group consisting of CeN, CrN, DyN, ErN, EuN, GdN, HoN, LaN, LuN, NbN, NdN, PrN, PuN, ScN, SmN, TbN, ThN, TiN, TmN, UN, VN, YN, YbN and ZrN.

In one aspect of the present invention, the insulating substrate is preferably of an oxide material selected from the group consisting of MgO, $LiGaO_2$, $LiAlO_2$, ZnO, $LiMgO_3$ and $Al_2O_3$.

In one aspect of the present invention, the group III–V type nitride compound semiconductor layer preferably includes a first contact layer of a first conductivity formed on the metal nitride layer, a first clad layer of the first conductivity formed on the first contact layer, a light emitting layer formed on the first clad layer, a second clad layer of a second conductivity formed on the light emitting layer, and a second contact layer of the second conductivity formed on the second clad layer.

In one aspect of the present invention, preferably the group III–V type nitride compound semiconductor device is applied as a light emitting diode device and the metal nitride layer is formed to cover the entirety of a first surface of the insulating substrate.

More preferably, the device is also provided with a second metal nitride layer formed to the entirety of a second surface of the insulating substrate, the second surface being different from the first surface.

In one aspect of the present invention, preferably the group III–V type nitride compound semiconductor device is applied as a laser diode device, the metal nitride layer is formed at a predetermined portion on the first surface of the insulating substrate.

In one aspect of the present invention, preferably the group III–V type nitride compound semiconductor device is applied as a laser diode device, the metal nitride layer is formed to cover the entirety of the first surface of the insulating substrate, the second electrode is formed at a predetermined portion on the second contact layer.

Still preferably, the device is also provided with a second metal nitride layer formed to cover the entirety of a second surface of the insulating substrate, the second surface being different from the first surface.

In another aspect of the present invention, a method of manufacturing a group III–V type nitride compound semiconductor device includes the steps of: forming a metal nitride layer of a conductivity on a first surface of an insulating substrate; forming a group III–V type nitride compound semiconductor layer on the metal nitride layer by vapor growth; forming an opening at a portion of the insulating substrate; forming a first electrode at the opening such that the first electrode is in contact with the metal nitride layer; and forming a second electrode on the group III–V type nitride compound semiconductor layer.

In another aspect of the present invention, the metal nitride layer preferably consists of any of nitrides of any element which belongs to the groups 3A, 4A, 5A and 6A in the periodic table.

More specifically, the metal nitride layer contains at least one material selected from the group consisting of CeN, CrN, DyN, ErN, EuN, GdN, HoN, LaN, LuN, NbN, NdN, PrN, PuN, ScN, SmN, TbN, ThN, TiN, TmN, UN, VN, YN YbN and ZrN.

In another aspect of the present invention, the insulating substrate is preferably of an oxide material selected from the group consisting of MgO, $LiGaO_2$, $LiAlO_2$, ZnO, $LiMgO_3$ and $Al_2O_3$.

In another aspect of the present invention, the step of forming an opening at a portion of the insulating substrate preferably includes forming the opening by reactive ion beam etching (RIBE).

In another aspect of the present invention, the method preferably also includes the step of dividing a plurality of group III–V type nitride compound semiconductor devices manufactured on the insulating substrate into chips.

In another aspect of the present invention, the step of forming a group III–V type nitride compound semiconductor layer preferably includes the steps of: forming a first contact layer of a first conductivity on the metal nitride layer; forming a first clad layer of the first conductivity on the first contact layer; forming a light emitting layer on the first clad layer; forming a second clad layer of a second conductivity on the light emitting layer; and forming a second contact layer of the second conductivity on the second clad layer.

In another aspect of the present invention, preferably the group III–V type nitride compound semiconductor device is applied as a light emitting diode device and the step of forming a metal nitride layer includes forming the metal nitride layer to cover the entirety of a first surface of the insulating substrate.

Preferably, the step of forming a metal nitride layer includes forming a second metal nitride layer covering the entirety of a second surface of the insulating substrate, the second surface being different from the first surface of the insulating substrate, the vapor growth is metal organic chemical vapor deposition (MOCVD), and the step of forming an opening at a portion of the insulating substrate includes forming an opening in the second metal nitride layer.

In another aspect of the present invention, preferably the group III–V type nitride compound semiconductor device is applied as a laser diode device and the step of forming a metal nitride layer includes forming the metal nitride layer at a predetermined portion on a first surface of the insulating substrate.

Preferably, the step of forming a metal nitride layer at a predetermined portion on a first surface of the insulating substrate includes the steps of: forming an insulating film with a first thickness on the insulating substrate; etching away a predetermined portion of the insulating film to form an insulating film pattern; forming a metal nitride layer with a second thickness on the insulating film pattern and on the insulating substrate etched and thus exposed, the second thickness being less than the first thickness; and removing the insulating film pattern and the metal nitride layer formed on the insulating film pattern.

In another aspect of the present invention, preferably the group III–V type nitride compound semiconductor device is applied as a laser diode device, the step of forming a metal nitride layer includes forming the metal nitride layer to cover the entirety of a first surface of the insulating substrate, and the step of forming the second electrode includes forming the second substrate at a predetermined portion on the second contact layer.

Preferably, the step of forming a metal nitride layer includes forming a second metal nitride layer to cover the entirety of a second surface of the insulating substrate, the second surface being different from the first surface of the insulating substrate, the vapor growth is metal organic chemical vapor deposition, and the step of forming an opening at a portion of the insulating substrate includes forming an opening also in the second metal nitride layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
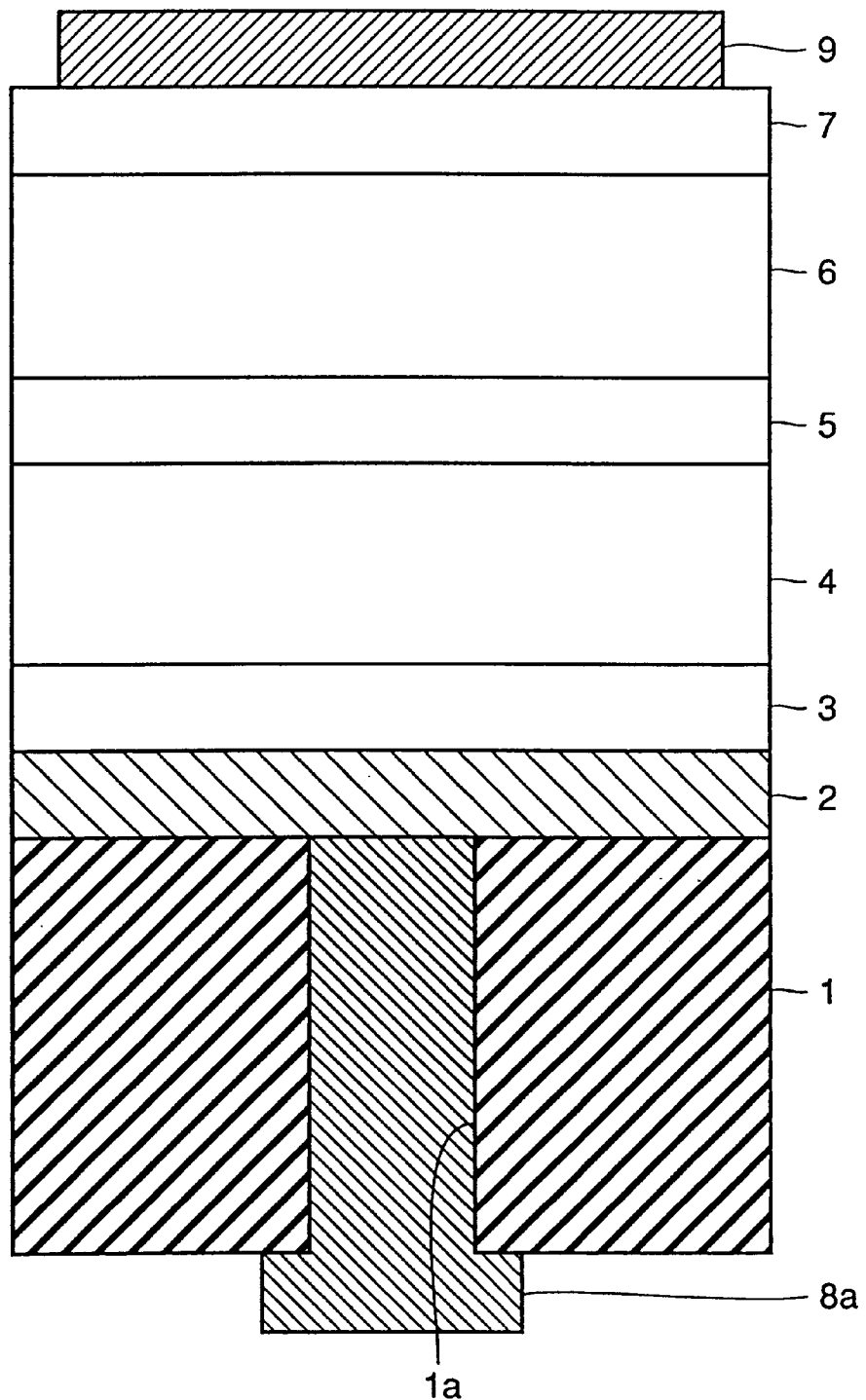
FIG. 1 is a cross section of a structure of a LED device as one example of a group III–V type nitride compound semiconductor device according to the present invention.

FIG. 1 is a cross section of a structure of a light emitting diode (LED) device as one example of a group III–V type nitride compound semiconductor device according to the present invention.

The LED device shown in FIG. 1 has a MgO substrate 1 having a (111) plane as a main surface, and a TiN single crystal thin film 2 (film thickness: 1 $\mu$m) formed to cover the entirety of the front surface of MgO substrate 1. Successively formed on TiN single crystal thin film 2 are an n-type GaN contact layer 3 (film thickness: 0.2 $\mu$m, carrier concentration: $1\times10^{19}$ cm$^{-3}$), an n-type Al$_{0.15}$Ga$_{0.85}$N clad layer 4 (film thickness: 1.0 $\mu$m, carrier concentration: $5\times10^{17}$ cm$^{-3}$), an i-type In$_{0.2}$Ga$_{0.8}$N light emitting layer 5 (film thickness: 10 nm), a p-type Al$_{0.15}$Ga$_{0.85}$N clad layer 6 (film thickness: 0.8 $\mu$m, carrier concentration: $5\times10^{17}$ cm$^{-3}$), and a p-type GaN contact layer 7 (film thickness: 0.2 $\mu$m, carrier concentration: $5\times10^{18}$ cm$^{-3}$). Formed on p-type GaN contact layer 7 is a transparent, p-type electrode 9. MgO substrate 1 is provided with an opening 1a by removing a portion of MgO substrate 1 so that the removal reaches TiN single crystal thin film 2. An n-type electrode 8a is formed in opening 1a such that n-type electrode 8a comes into contact with the exposed TiN single crystal thin film 2.

The dimensions of the LED device are 250 $\mu$m×250 $\mu$m and the dimensions of opening 1a formed in substrate 1 are 20 $\mu$m×20 $\mu$m. Thus, opening 1a is a sufficiently small window relative to the dimensions of the LED device and the mechanical strength of substrate 1 will not be degraded.

Figure 2:
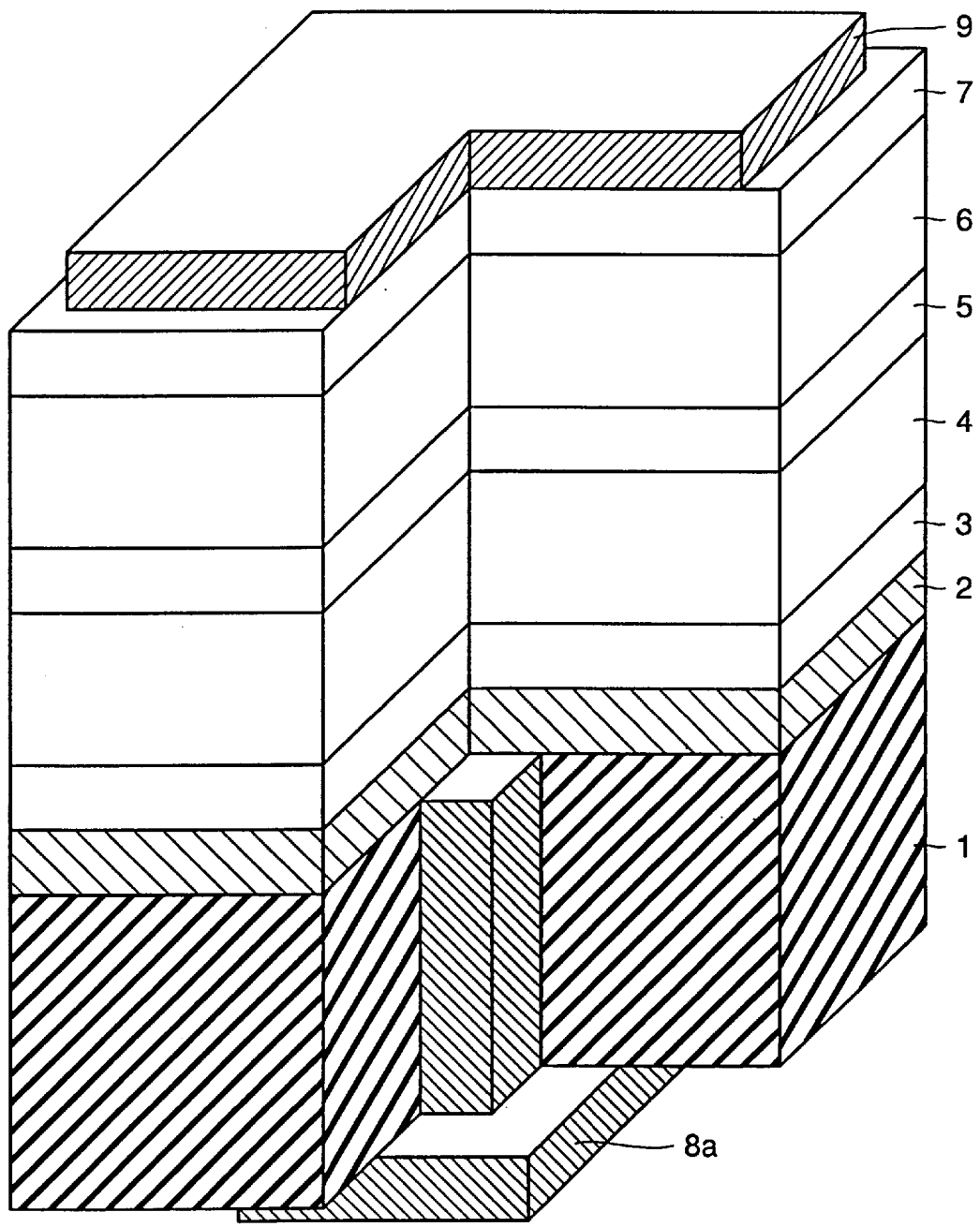
FIG. 2 is a perspective view of the structure of the LED device shown in FIG. 1.

FIG. 2 is a perspective view of the structure of the LED device shown in FIG. 1. It should be noted that while the LED device shown in FIG. 2 is notched to readily understand the internal structure of the LED device, actual LED device does not require such a notching.

A method of manufacturing the FIG. 1 LED device thus structured will now be considered.

FIGS. 3–14 illustrate a method of manufacturing the FIG. 1 LED device thus structured.

Figure 3:
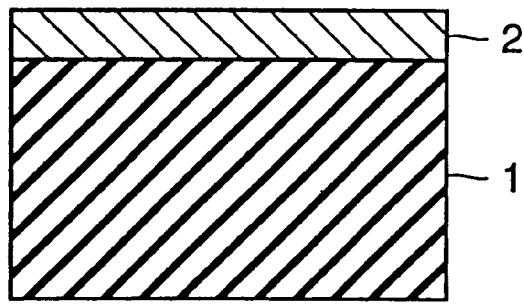
FIGS. 3–14 illustrate a method of manufacturing the LED device shown in FIG. 1.

Referring first to FIG. 3, grown on the entirety of the front surface of MgO substrate 1 with a (111) plane as a main surface is a TiN single crystal thin film 2 of 1 $\mu$m in film thickness by reactive sputtering at a substrate temperature of 800° C.

Figure 4:
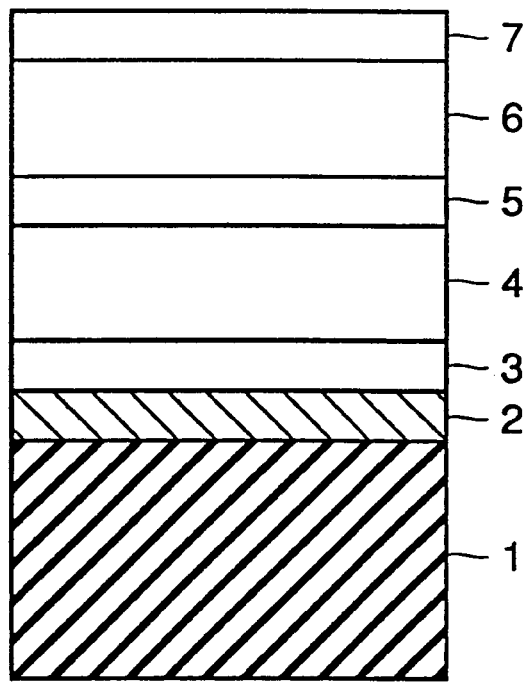

Referring now to FIG. 4, successively grown on TiN single crystal thin film 2 are n-type GaN contact layer 3, n-type Al$_{0.15}$Ga$_{0.85}$N clad layer 4, i-type In$_{0.2}$Ga$_{0.8}$N light emitting layer 5, p-type Al$_{0.15}$Ga$_{0.85}$N clad layer 6 and p-type GaN contact layer 7 by means of metal organic chemical vapor deposition.

Then, an opening 1a is formed in MgO substrate 1 to form n-type electrode 8a as a lower electrode, as shown in FIGS. 5–9.

Figure 5:
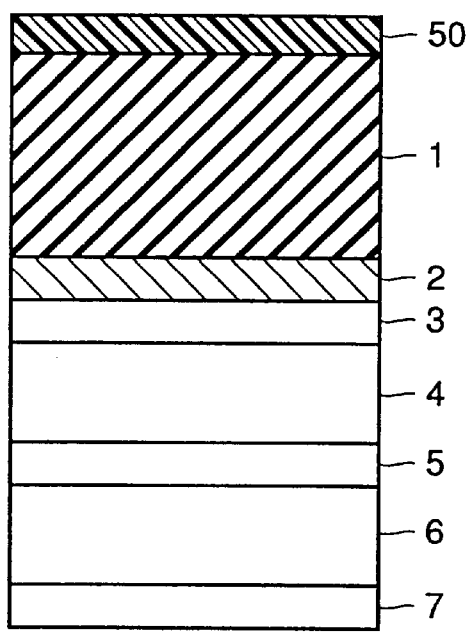

Referring now to FIG. 5, resist 50 is applied on the entire back surface of MgO substrate 1.

Figure 6:
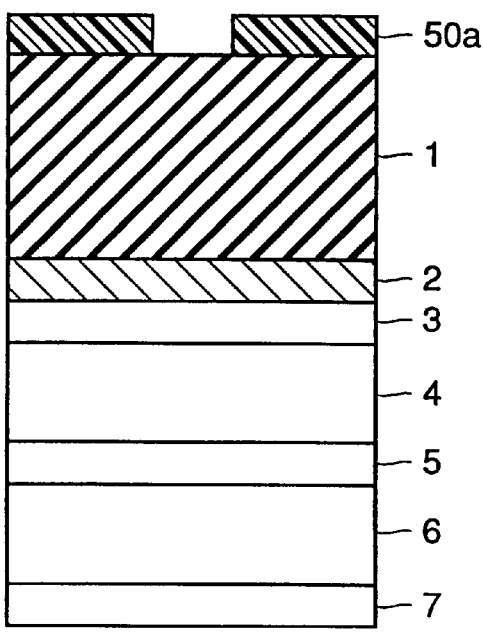

Referring now to FIG. 6, a mask having a predetermined pattern (not shown) is applied and exposure and then development are provided to form a resist pattern 50a with a window of 20 $\mu$m×20 $\mu$m in dimensions at a center thereof.

Figure 7:
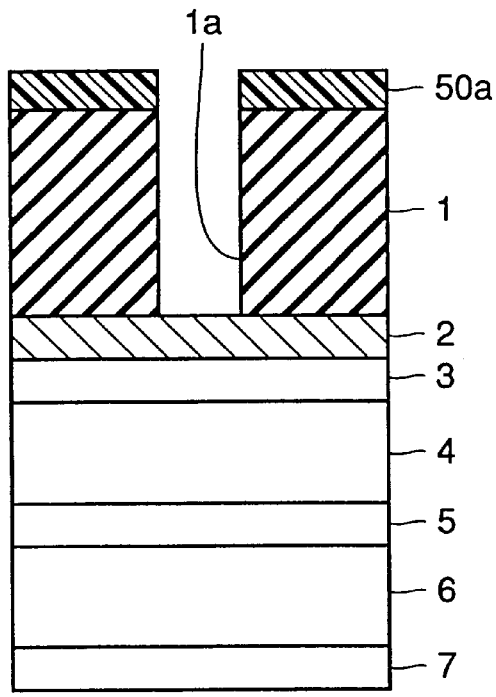

Referring now to FIG. 7, resist pattern 50a is used as a mask to partially remove MgO substrate 1 by means of reactive ion beam etching with chlorine so that the removal reaches TiN single crystal thin film 2 to form an opening 1a.

Figure 8:
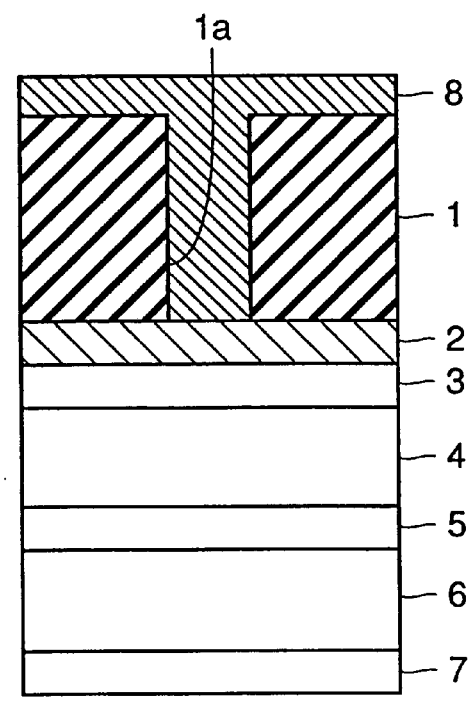

Referring now to FIG. 8, resist pattern 50a is removed and n-type electrode layer 8 is provided through vapor deposition such that n-type electrode layer 8 is placed on a back surface of MgO substrate 1 and in opening 1a such that n-type electrode layer 8 is in contact with the exposed TiN single crystal thin film 2.

Figure 9:
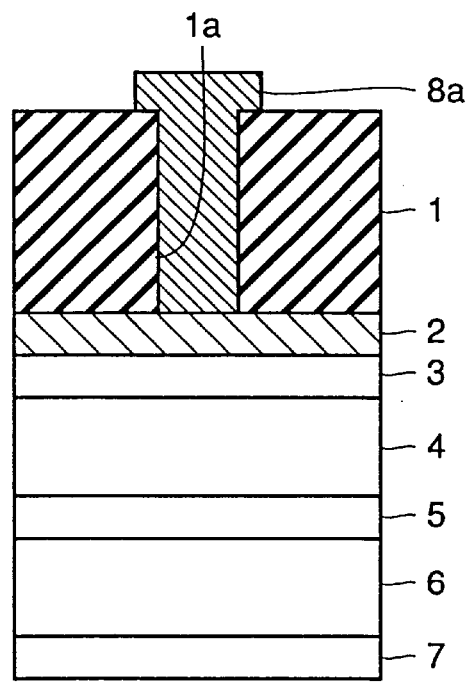

Referring now to FIG. 9, n-type electrode layer 8 is patterned as predetermined to form an n-type electrode 8a as a lower electrode.

Then, a p-type electrode 9 as an upper electrode is formed on p-type GaN contact layer 7, as shown in FIGS. 10–13.

Figure 10:
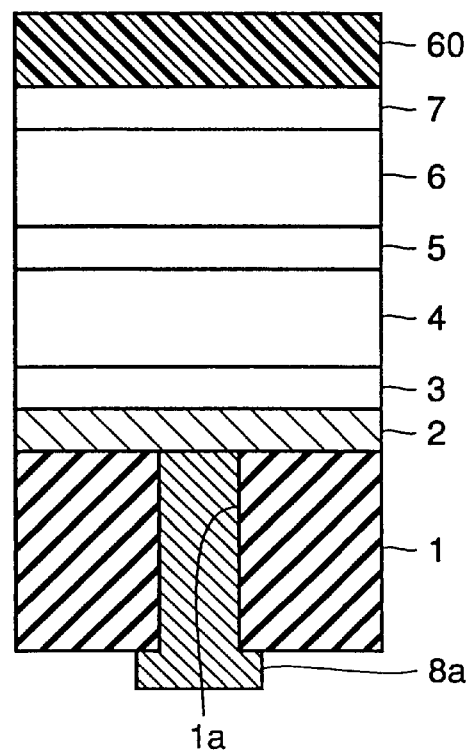

Referring first to FIG. 10, resist 60 is applied on p-type GaN contact layer 7.

Figure 11:
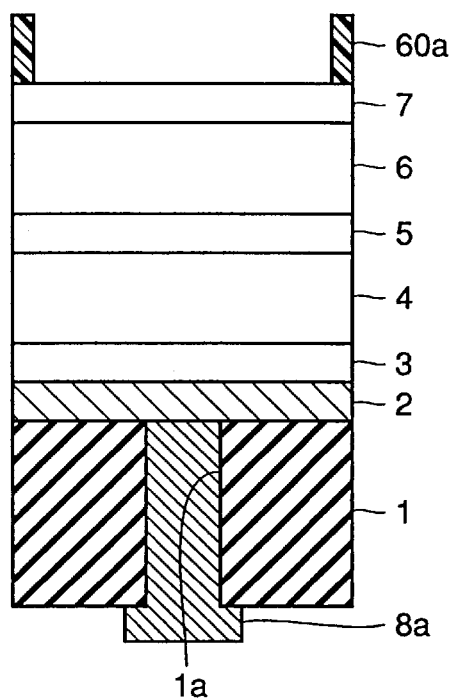

Referring now to FIG. 11, a mask of a predetermined pattern (not shown) is applied and exposure and then development are provided to form a resist pattern 60a.

Figure 12:
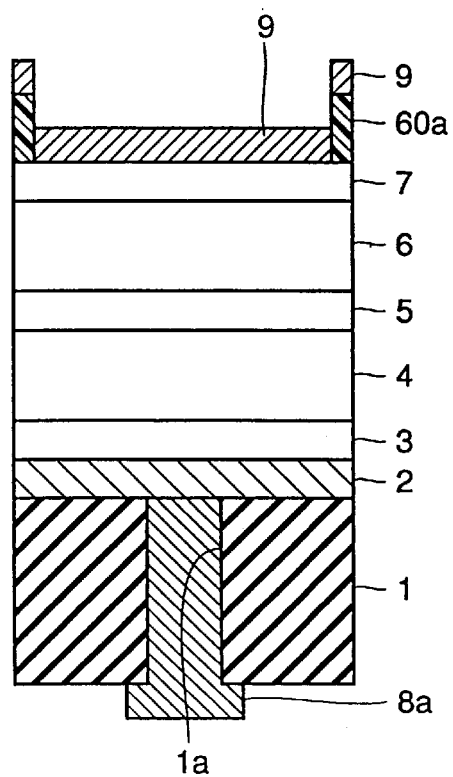

Referring now to FIG. 12, p-type electrode 9 is provided through vapor deposition on resist pattern 60a and on the exposed p-type GaN contact layer 7.

Figure 13:
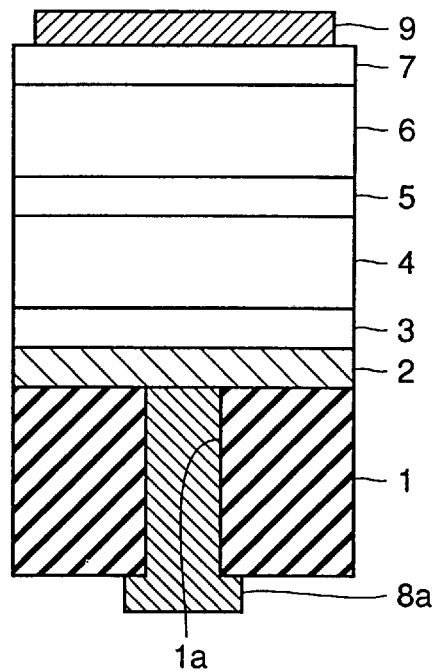

Referring now to FIG. 13, resist pattern 60a and p-type electrode 9 thereon are removed to form p-type electrode 9 as an upper electrode.

Figure 14:
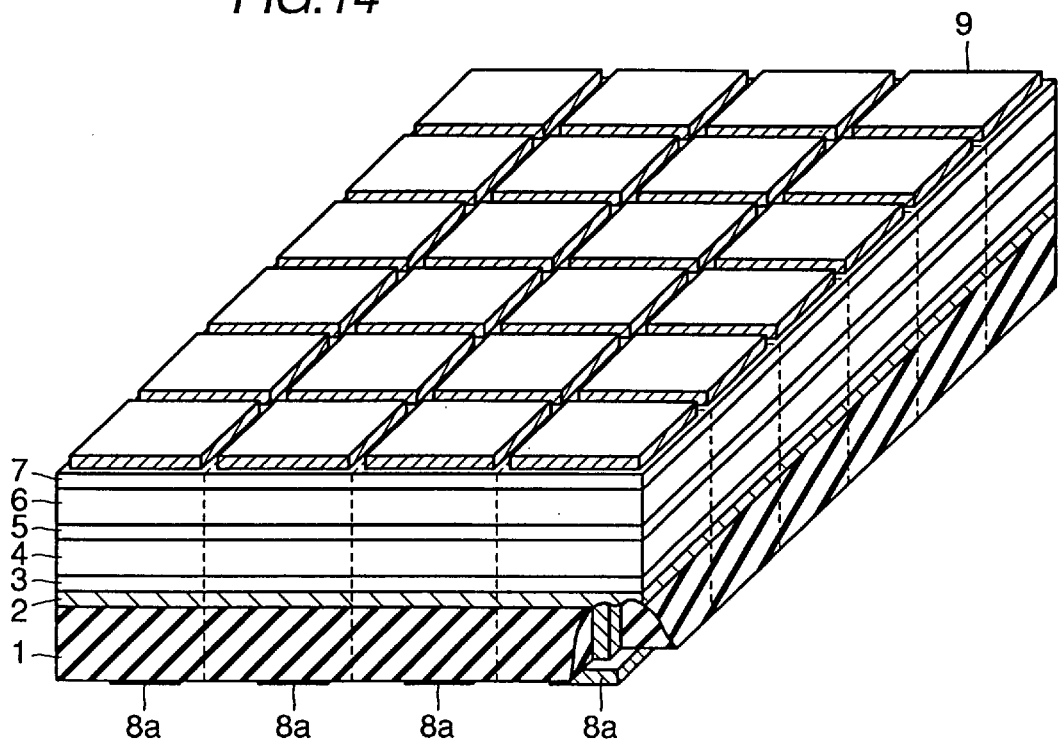

For convenience of description, FIGS. 3–13 show a single semiconductor device manufactured on an insulating substrate. In practically manufacturing semiconductor devices, however, a plurality of semiconductor devices are manufactured on insulating substrate 1, as shown in FIG. 14, through the process illustrated in FIGS. 3–13, and are divided into chips by dicing, for example.

Figure 15:
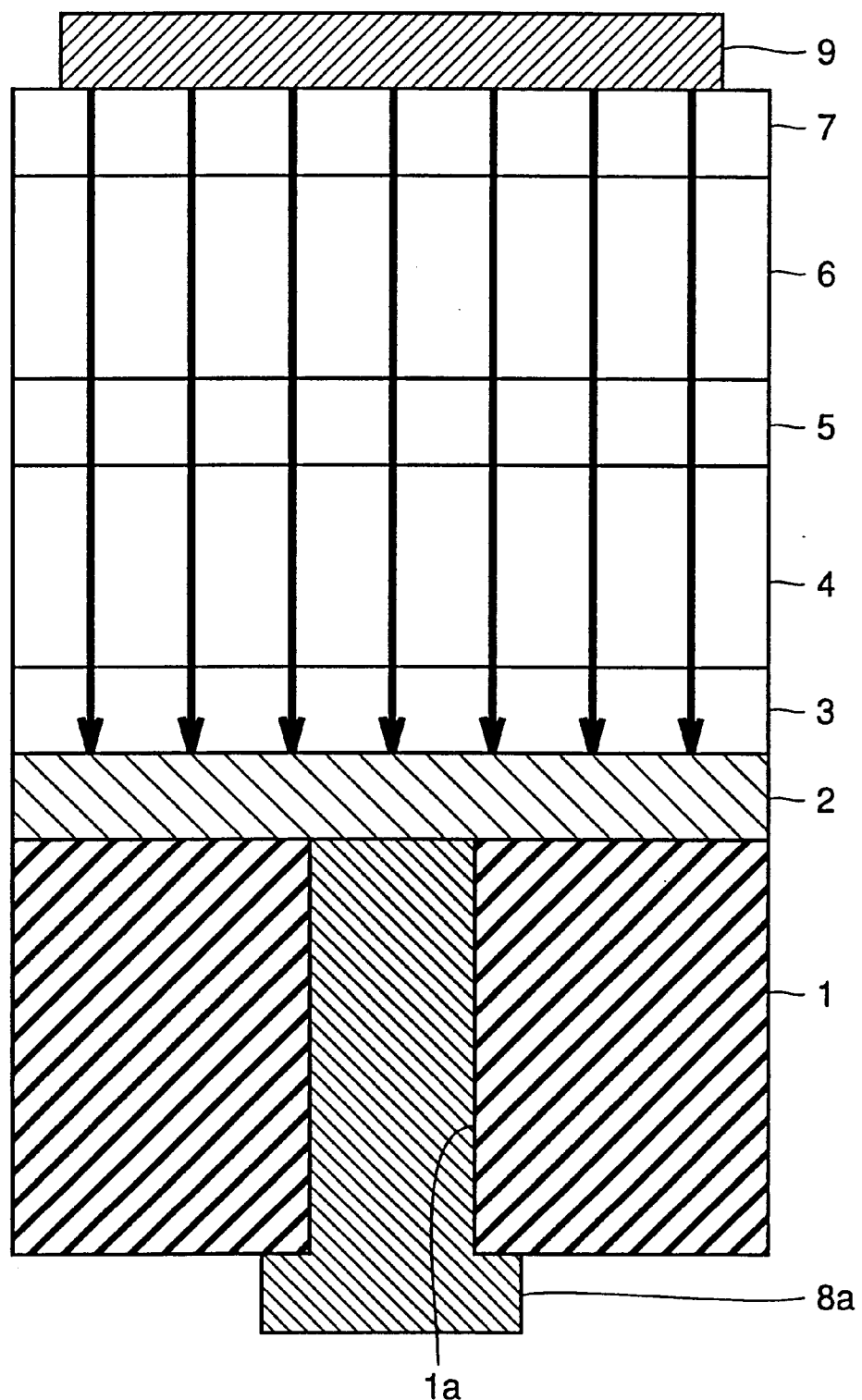
FIG. 15 is a cross section schematically showing a flow of current in the LED device shown in FIG. 1.

FIG. 15 is a cross section schematically showing a flow of current in the FIG. 1 LED device thus manufactured.

In the LED device shown in FIG. 15, TiN single crystal thin film 2 acts as an electrode. Accordingly, the current injected from p-type electrode 9 can be passed uniformly to semiconductor layers 3, 4, 5, 6 and 7.

Figure 16:
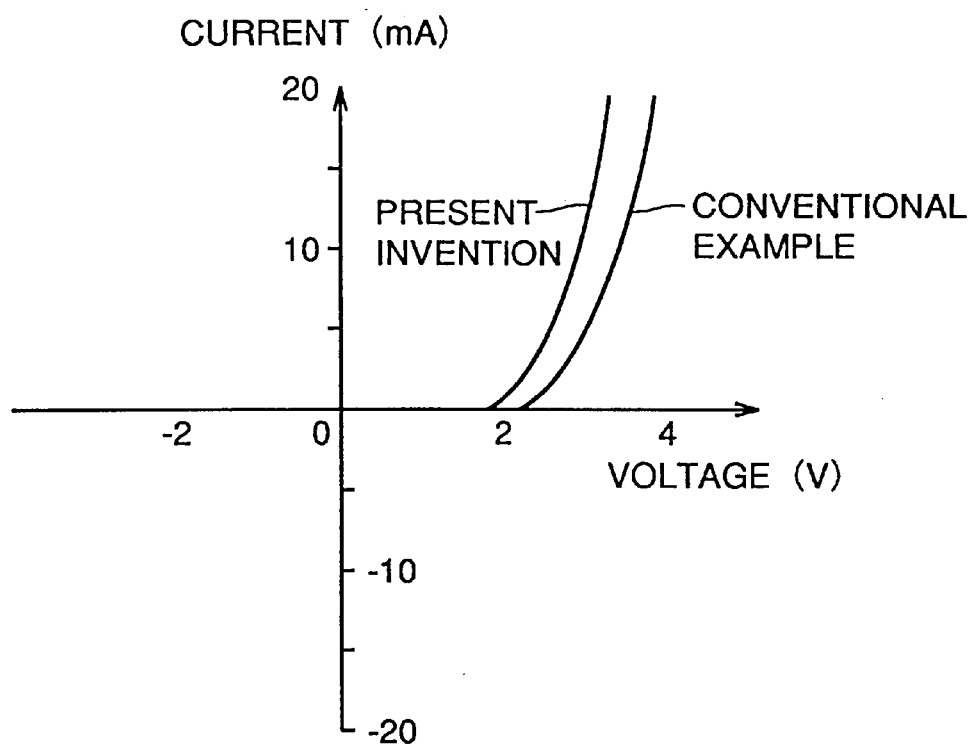
FIG. 16 shows a comparison in current-voltage characteristic between a conventional LED device and a LED device according to the present invention.
Figure 34:
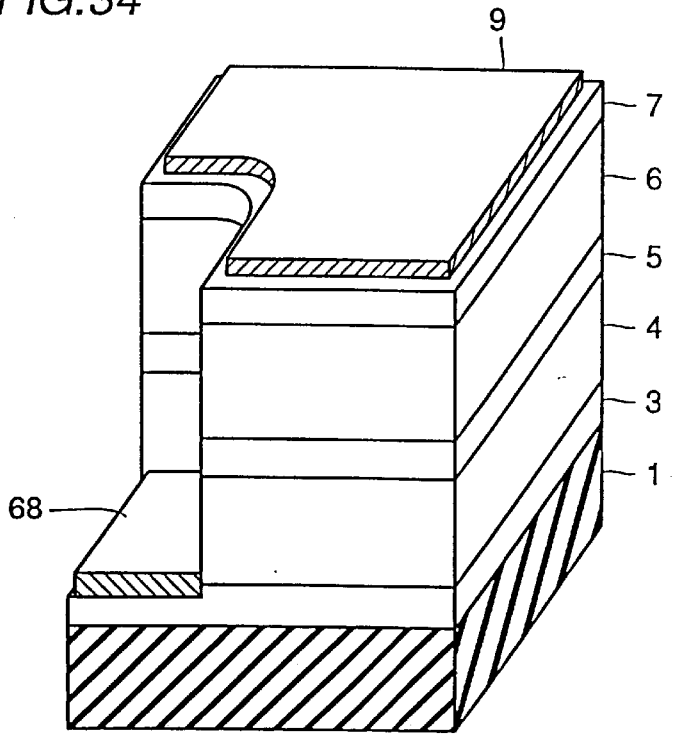
FIG. 34 is a perspective view of a LED device as one example of conventional group III–V type nitride compound semiconductor devices.

FIG. 16 expresses a comparison in current-voltage characteristic between a conventional LED device and a LED device according to the present invention. In FIG. 16, the horizontal axis represents voltage (V) and the vertical axis represents current (mA). The LED device shown in FIG. 1 is used as the LED device according to the present invention, and the LED device shown in FIG. 34 as the conventional LED device.

Referring to FIG. 16, the LED device according to the present invention has TiN single crystal thin film 2 acting as an electrode. As such, the electrode area of the LED device according to the present invention almost matches the chip size. By contrast, the electrode area of the conventional LED device is the size of a removed portion of the substrate. Accordingly, the graph representing the current-voltage characteristic of the LED device according to the present invention rises steeper than that of the conventional LED device, as shown in FIG. 16.

Furthermore, the current-voltage characteristic of the LED device according to the present invention is examined while changing the dimensions of the opening formed by removing the substrate. As a result, it has been found that the current-voltage characteristic do not change regardless of the dimensions of the opening.

Figure 17:
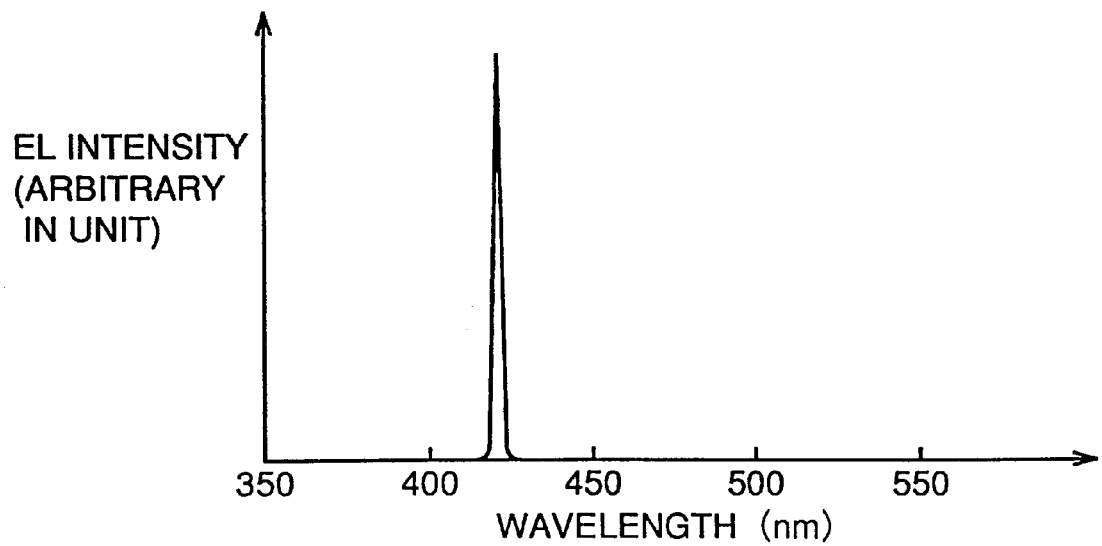
FIG. 17 represents an emission spectrum of the FIG. 1 LED device according to the present embodiment.

FIG. 17 represents an emission spectrum of the FIG. 1 LED device according to the present invention. In FIG. 17, the horizontal axis represents wavelength (nm) and the vertical axis represents electroluminescence (EL) intensity (arbitrary in unit).

The LED device shown in FIG. 1 uses an InGaN quantum well light emission layer as light emitting layer 5 and the emission FWHM can thus be reduced to as narrow as approximately 30 Å.

Second Embodiment

Figure 18:
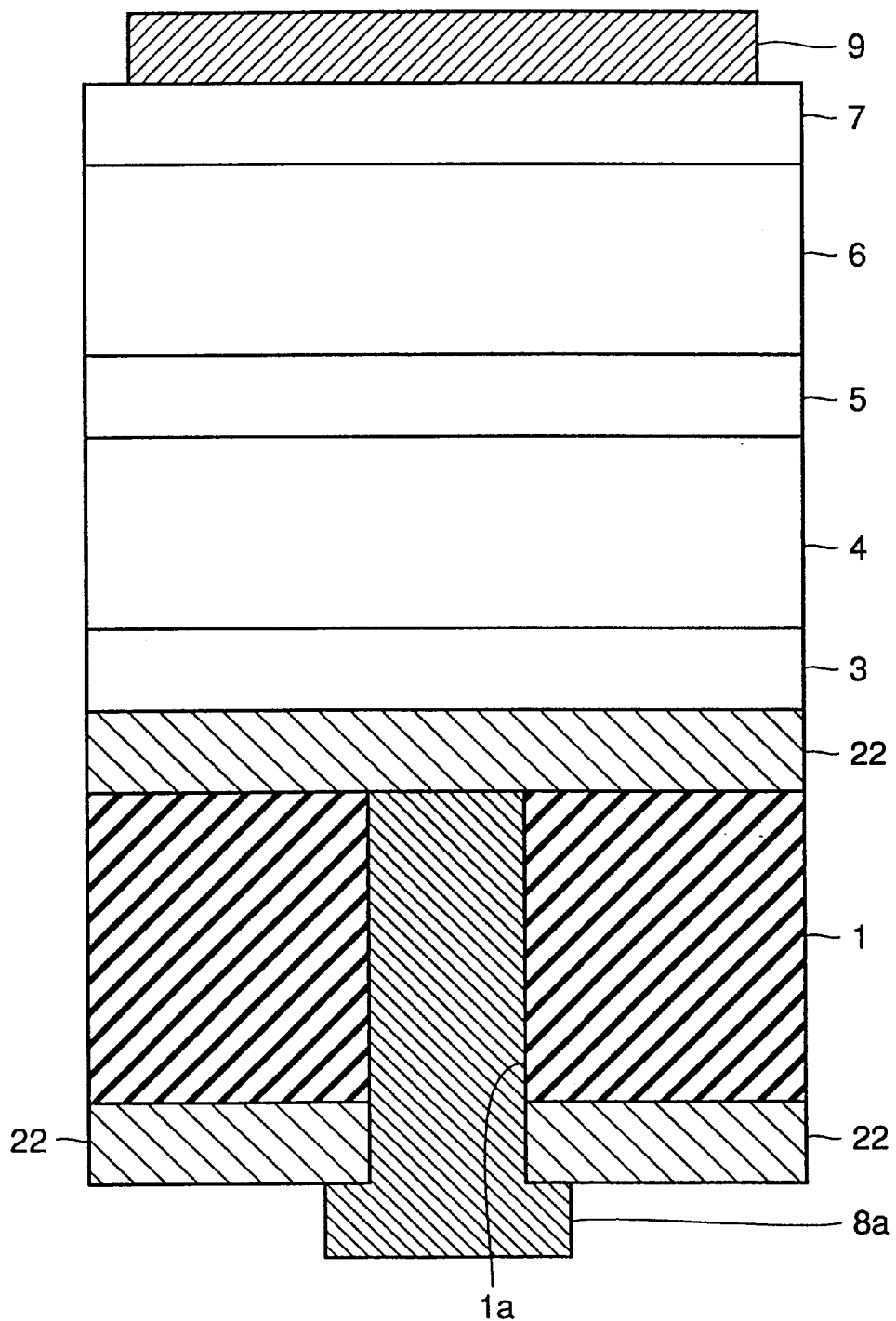
FIG. 18 is a cross section of a structure of a LED device as another example of the group III–V type nitride compound semiconductor device according to the present invention.

FIG. 18 is a cross section of a structure of a LED device as another example of the group III–V type nitride compound semiconductor device according to the present invention.

The LED device shown in FIG. 18 includes a $LiAlO_2$ substrate 1 with a (100) plane as a main surface, and a CrN single crystal thin film 22 (film thickness: 2 $\mu$m) covering the entirety of the front and back surfaces of $LiAlO_2$ substrate 1. Successively formed on CrN single crystal thin film 22 formed on the front surface of $LiAlO_2$ substrate 1 are n-type GaN contact layer 3 (film thickness: 0.2 $\mu$m, carrier concentration: $1\times10^{19}$ cm$^{-3}$), n-type $Al_{0.15}Ga_{0.85}N$ clad layer 4 (film thickness: 1.0 $\mu$m, carrier concentration: $5\times10^{17}$ cm$^{-3}$), i-type $In_{0.2}Ga_{0.8}N$ light emitting layer 5 (film thickness: 100 Å), p-type $Al_{0.15}Ga_{0.85}N$ clad layer 6 (film thickness: 0.8 $\mu$m, carrier concentration: $5\times10^{17}$ cm$^{-3}$), and p-type GaN contact layer 7 (film thickness: 0.2 $\mu$m, carrier concentration: $5\times10^{18}$ cm$^{-3}$). Formed on p-type GaN contact layer 7 is transparent p-type electrode 9. $LiAlO_2$ substrate 1 is provided with opening 1a by partially removing substrate 1 so that the removal reaches CrN single crystal thin film 22 formed on the front surface of substrate 1. An opening is also formed in CrN single crystal thin film 22 formed on the back surface of $LiAlO_2$ substrate 1. In opening 1a, n-type electrode 8a is formed in contact with CrN single crystal thin film 22 formed on the front surface of the substrate.

The remainder of the structure is identical to the structure of the FIG. 1 LED device according to the first embodiment and a description thereof will not be repeated.

A method of manufacturing the FIG. 18 LED device thus structured will now be described.

Initially, CrN single crystal thin film 22 of 2 $\mu$m in thickness is grown on the entire front and back surfaces of $LiAlO_2$ substrate 1 with a (100) plane as a main surface by reactive sputtering at a substrate temperature of 800° C.

Then, n-type GaN contact layer 3, n-type $Al_{0.15}Ga_{0.85}N$ clad layer 4, i-type $In_{0.2}Ga_{0.8}N$ light emission layer 5, p-type $Al_{0.15}Ga_{0.85}N$ clad layer 6 and p-type GaN contact layer 7 are successively grown by means of metal organic chemical vapor deposition on CrN single crystal thin film 22 formed on the front surface of $LiAlO_2$ substrate 1 and then opening 1a is formed in $LiAlO_2$ substrate 1 and CrN single crystal thin film 22 formed on the back surface of substrate 1 to form n-type electrode 8a as a lower electrode.

The remainder of the process is the same as the method of manufacturing the LED device according to the first embodiment illustrated in FIGS. 3–14 and a description thereof will not be repeated.

For comparison, not the back surface but only the front surface of a $LiAlO_2$ substrate is covered with thin metal nitride film and a nitride-based compound semiconductor layer is grown by metal organic chemical vapor deposition. As a result, the $LiAlO_2$ substrate is decomposed by the intensive reductive ambient in the reactor and a satisfactory nitride-based compound semiconductor layer cannot be grown.

By contrast, when the entire front and back surfaces of a $LiAlO_2$ substrate is covered with thin metal nitride film, as shown in FIG. 18, decomposition of the substrate can be prevented and a satisfactory nitride-based compound semiconductor layer can be grown by metal organic chemical vapor deposition.

Third Embodiment

Figure 19:
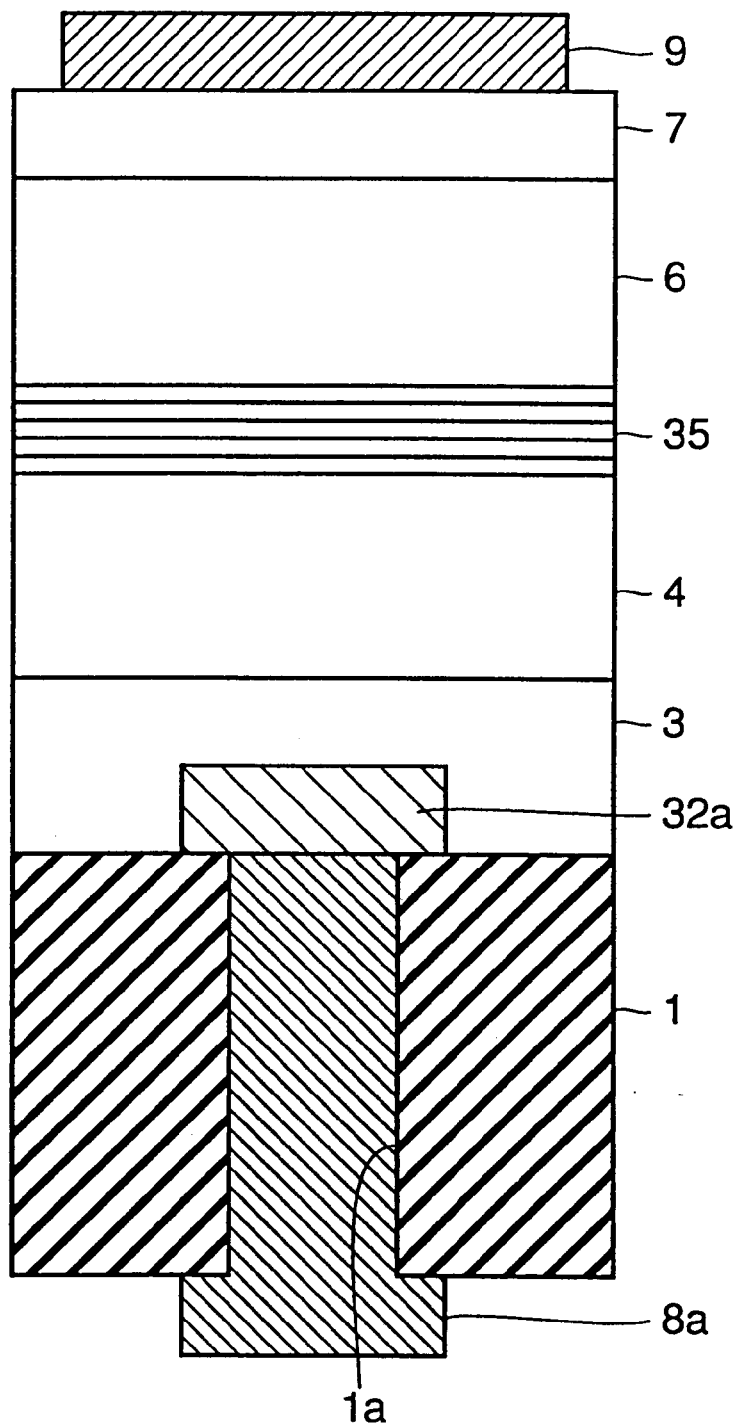
FIG. 19 is a cross section of a structure of a LD device as still another example of the group III–V type nitride compound semiconductor device according to the present invention.

FIG. 19 is a cross section of a structure of a laser diode (LD) device as still another example of the group III–V type nitride compound semiconductor device according to the present invention.

The LD device shown in FIG. 19 includes a $LiGaO_2$ substrate 1 with a (001) plane as a main surface, and a TiN single crystal thin film 32a (film thickness: 1 μm) formed in stripes at a predetermined portion on the front surface of LiGaO$_2$ substrate 1. Successively formed on LiGaO$_2$ substrate 1 and TiN single crystal thin film 32a are n-type GaN contact layer 3 (film thickness: 0.2 μm, carrier concentration: 1×10$^{19}$ cm$^{-3}$), n-type Al$_{0.2}$Ga$_{0.8}$N clad layer 4 (film thickness: 1.0 μm, carrier concentration: 5×10$^{17}$ cm$^{-3}$), i-type In$_{0.2}$Ga$_{0.8}$N/In$_{0.05}$Ga$_{0.95}$N triple quantum well light emitting layer 35 (film thickness: 50/100 Å), p-type Al$_{0.2}$Ga$_{0.8}$N clad layer 6 (film thickness: 0.8 nm, carrier concentration: 5×10$^{17}$ cm$^{-3}$), and p-type GaN contact layer 7 (film thickness: 0.2 μm, carrier concentration: 5×10$^{18}$ cm$^{-3}$). P-type electrode 9 is formed on p-type GaN contact layer 7. LiGaO$_2$ substrate 1 is provided with opening 1a by removing a portion of substrate 1 so that the removal reaches TiN single crystal thin film 32a. In opening 1a, n-type electrode 8a is formed in contact with the exposed TiN single crystal thin film 32a.

In this LD device, the stripe width of the laser is 30 μm, the cavity length is 1 mm, the size of the substrate is 200 μm×1 mm, and the size of opening 1a formed in substrate 1 is 20 μm×50 μm. Thus, opening 1a is a sufficiently small window relative to the size of substrate 1 and the mechanical strength of substrate 1 will not be degraded.

Figure 20:
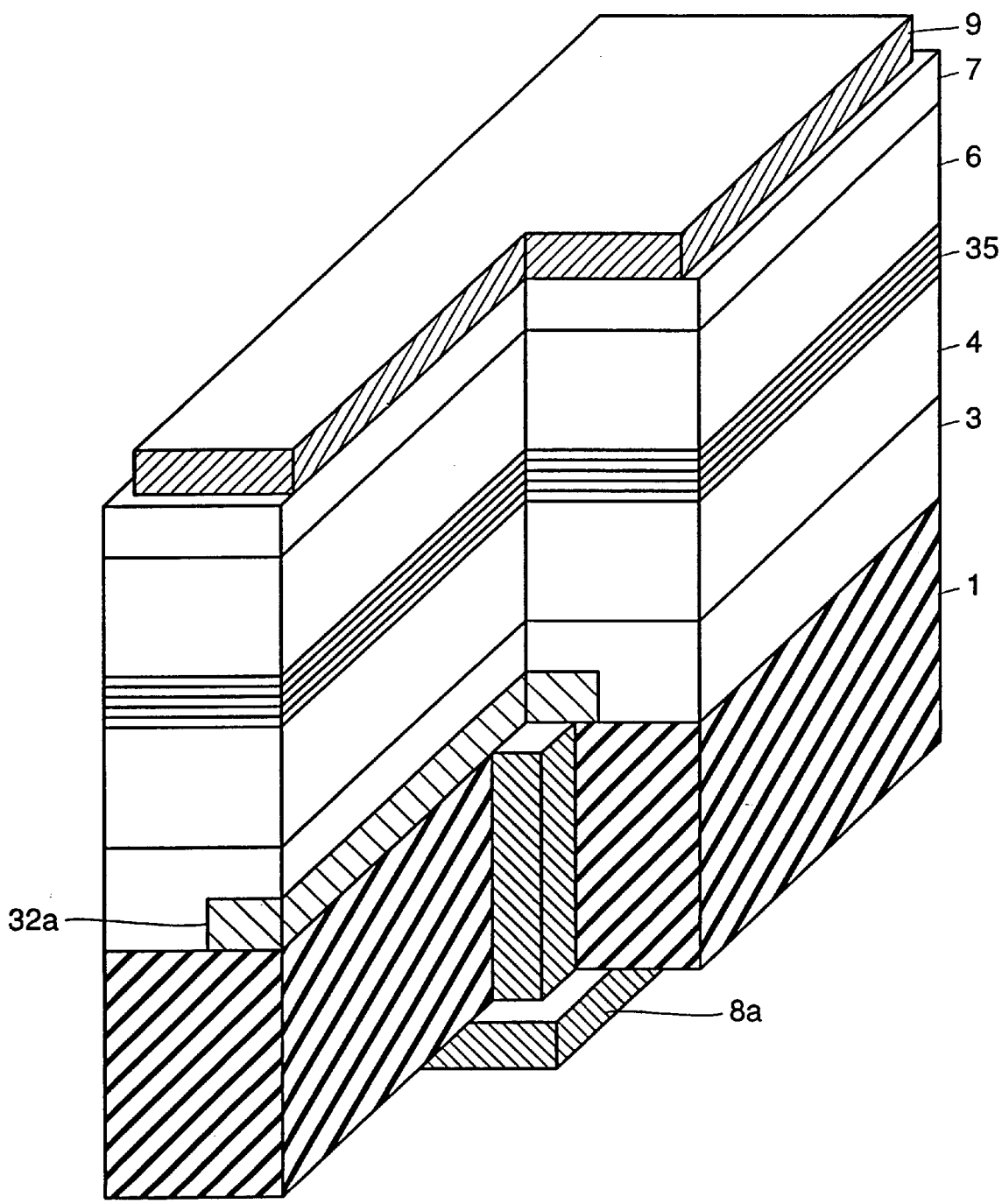
FIG. 20 is a perspective view of the structure of the LD device shown in FIG. 19.

FIG. 20 is a perspective view of the structure of the LD device shown in FIG. 19. Although FIG. 20 shows the LD device notched to readily understand the internal structure of the LD device, the actual LD device does not require such a notching.

FIGS. 21–28 illustrate a method of manufacturing the FIG. 19 LD device thus structured.

Figure 21:
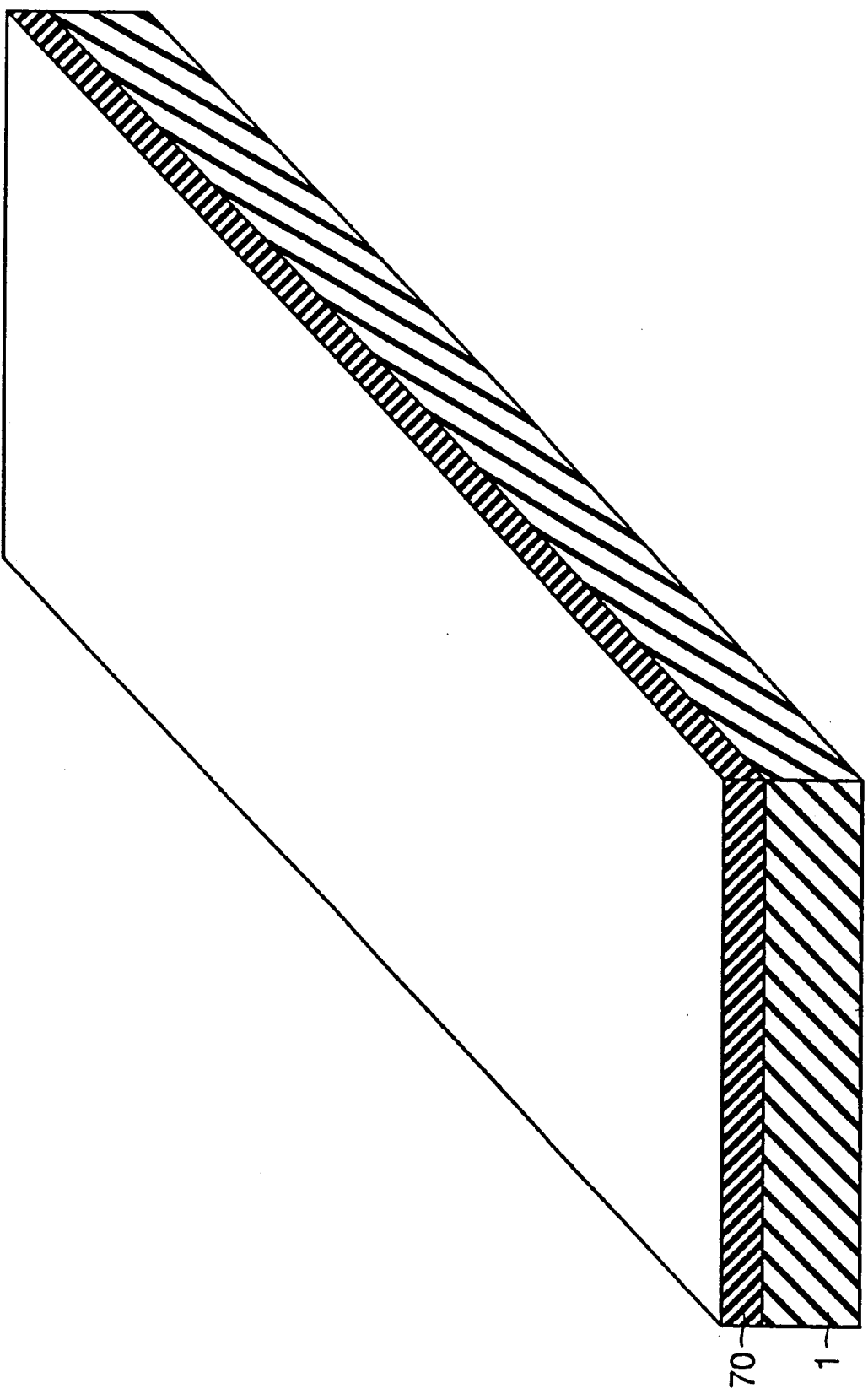
FIGS. 21–28 illustrate a method of manufacturing the LD device shown in FIG. 19.

Referring first to FIG. 21, a SiO$_2$ film 70 of 3 μm in thickness as an insulating film is formed on the entire front surface of LiGaO$_2$ substrate 1 with a (001) plane as a main surface. It should be noted that the material for the insulating film is not limited to SiO$_2$.

Figure 22:
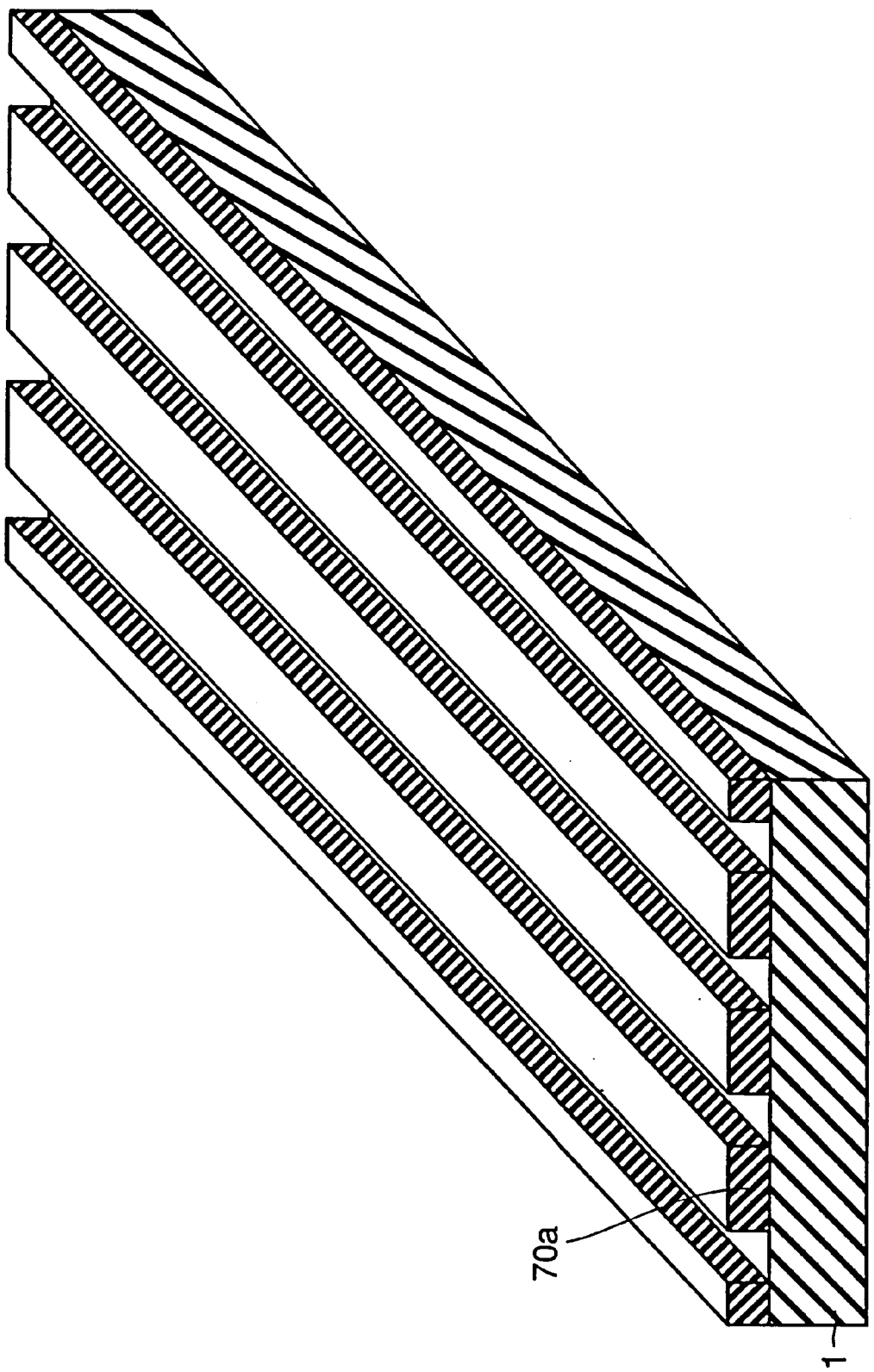
Figure 23:
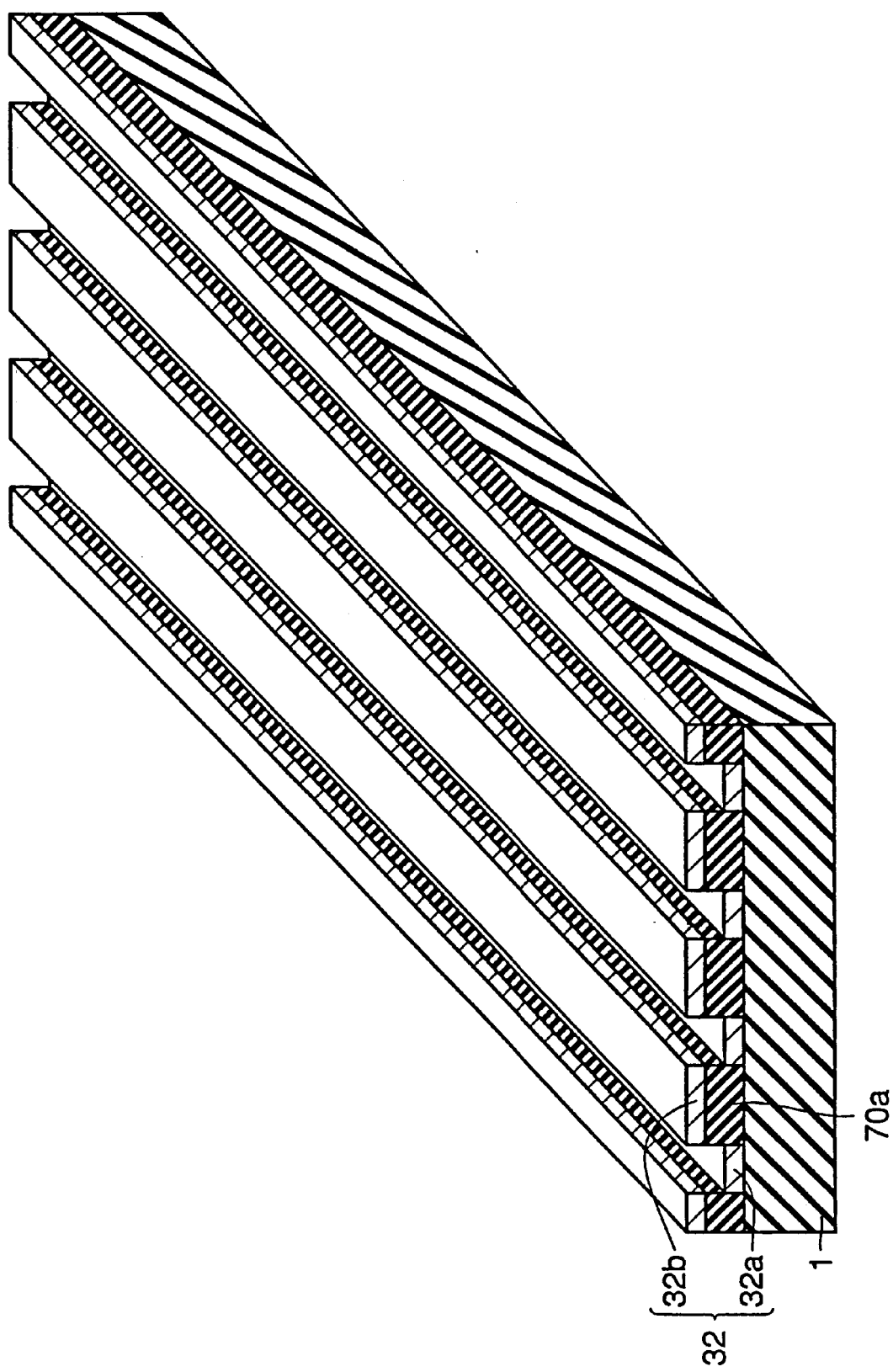

Referring now to FIG. 22, SiO$_2$ film 70 is etched to form grooves in stripes to form a SiO$_2$ film pattern 70a.

Reactive sputtering is then applied as in the first embodiment to grow TiN single crystal thin film 32 of 1 μm in film thickness at a substrate temperature of 800° C. Thus, TiN single crystal thin film 32a of 1 μm in thickness is formed on the LiGaO$_2$ substrate 1 exposed by the formation of the grooves by the etching. TiN single crystal thin film 32b of 1 μm in film thickness is also formed on SiO$_2$ film pattern 70a.

Figure 24:
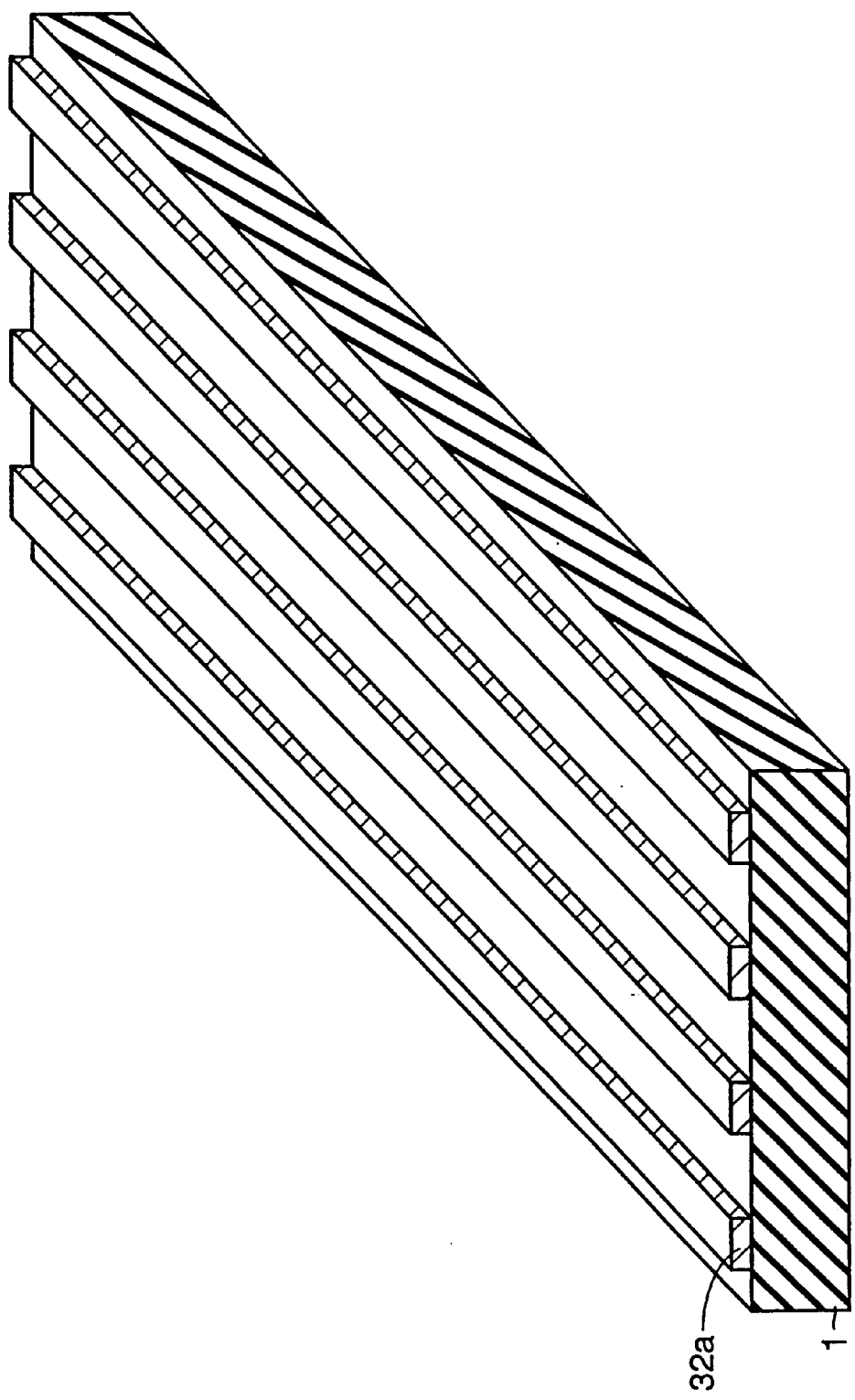

Referring now to FIG. 24, SiO$_2$ film pattern 70a and the TiN single crystal thin film 32b formed thereon are then removed to form TiN single crystal thin film 32a in stripes on substrate 1.

Figure 25:
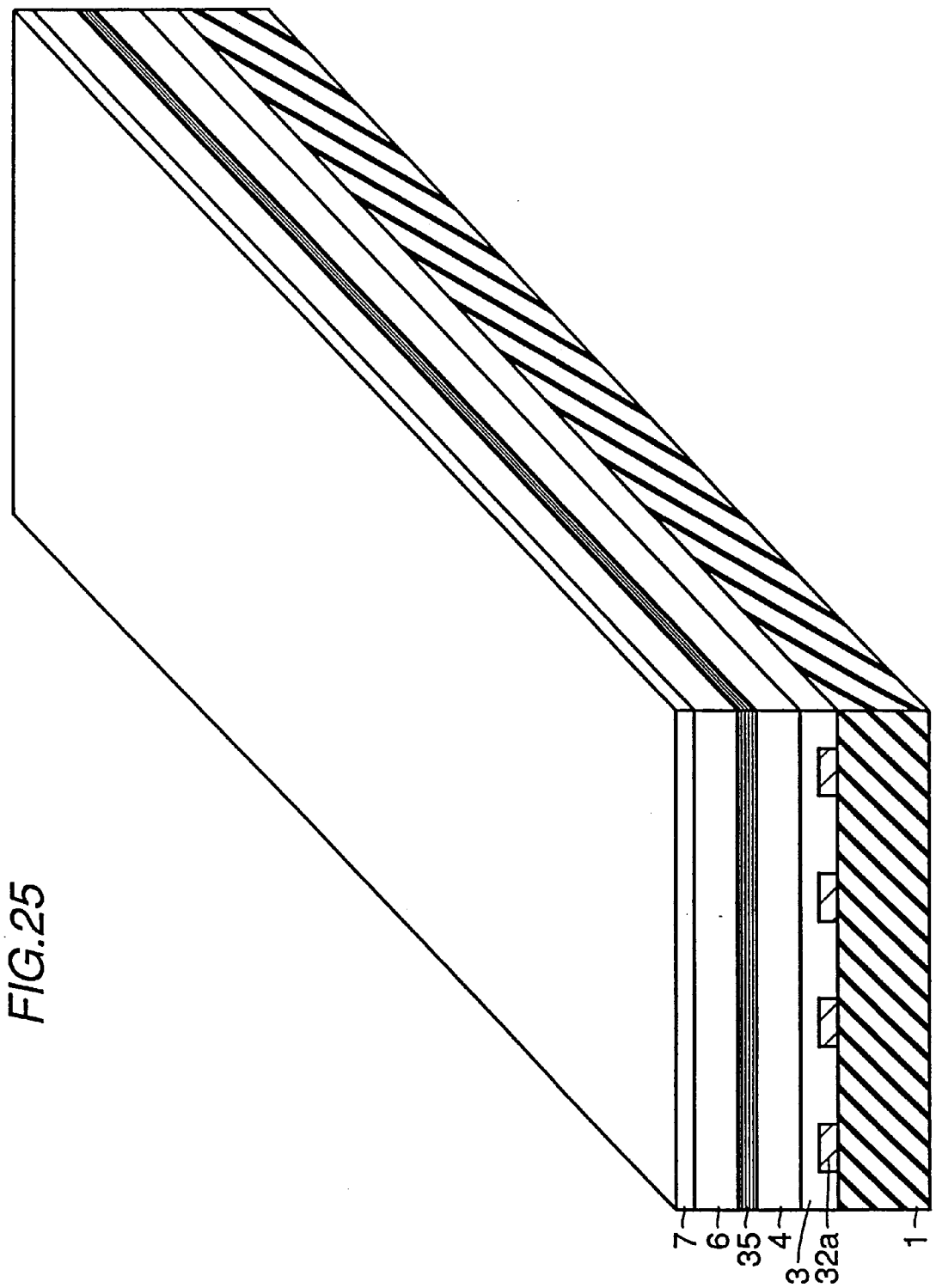

Referring now to FIG. 25, molecular beam epitaxial (MBE) growth is applied to successively grow n-type GaN contact layer 3, n-type Al$_{0.2}$Ga$_{0.8}$N clad layer 4, i-type In$_{0.2}$Ga$_{0.8}$N/In$_{0.05}$Ga$_{0.95}$N triple quantum well light emitting layer 35, p-type Al$_{0.2}$Ga$_{0.8}$N clad layer 6 and p-type GaN contact layer 7 on LiGaO$_2$ substrate 1 and TiN single crystal thin film 32a.

Figure 26:
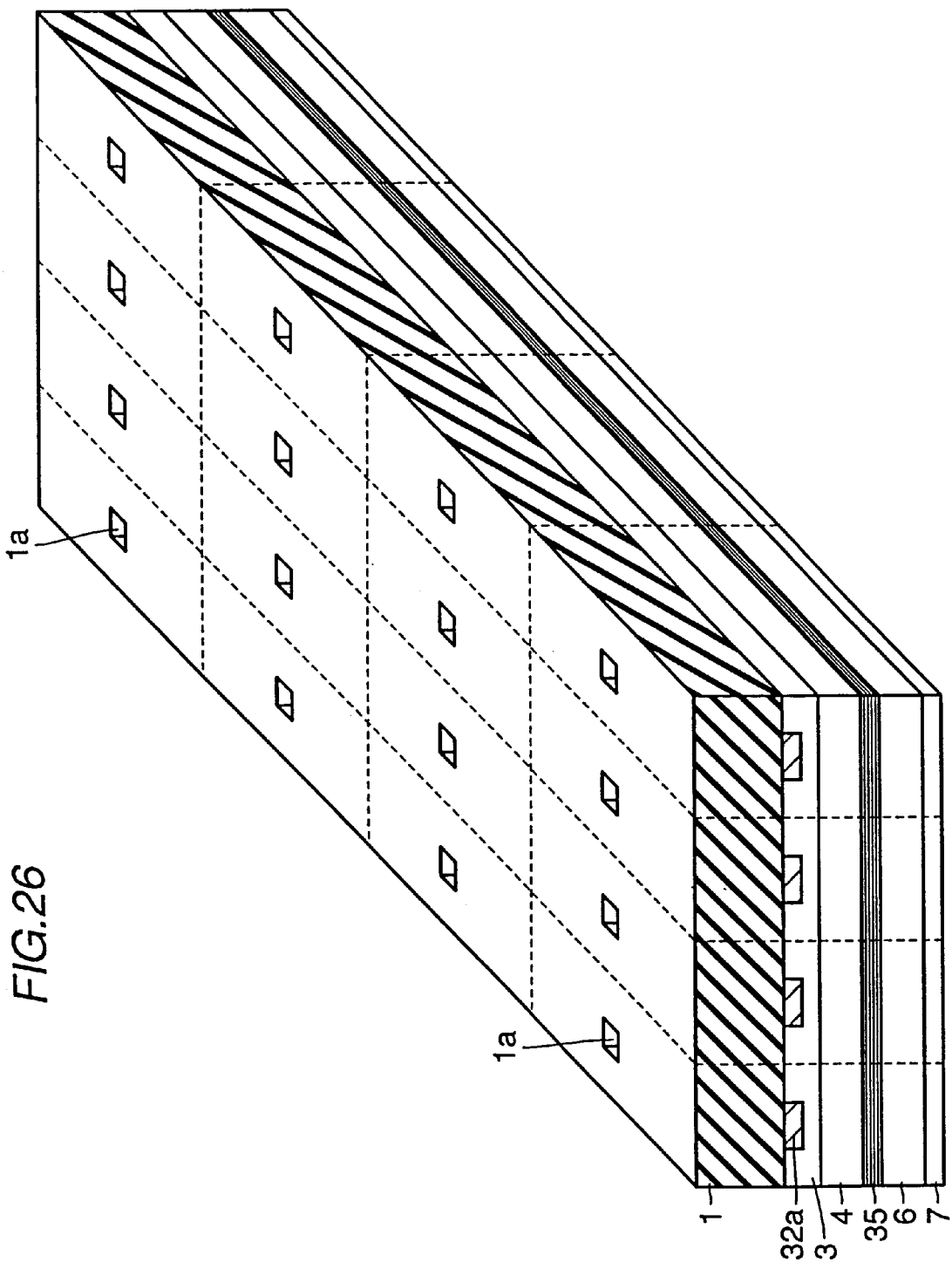

Referring now to FIG. 26, reactive ion beam etching which employs chlorine is applied to remove a portion of substrate 1 exactly under TiN single crystal thin film 32a to form opening 1a as in the first embodiment.

Figure 27:
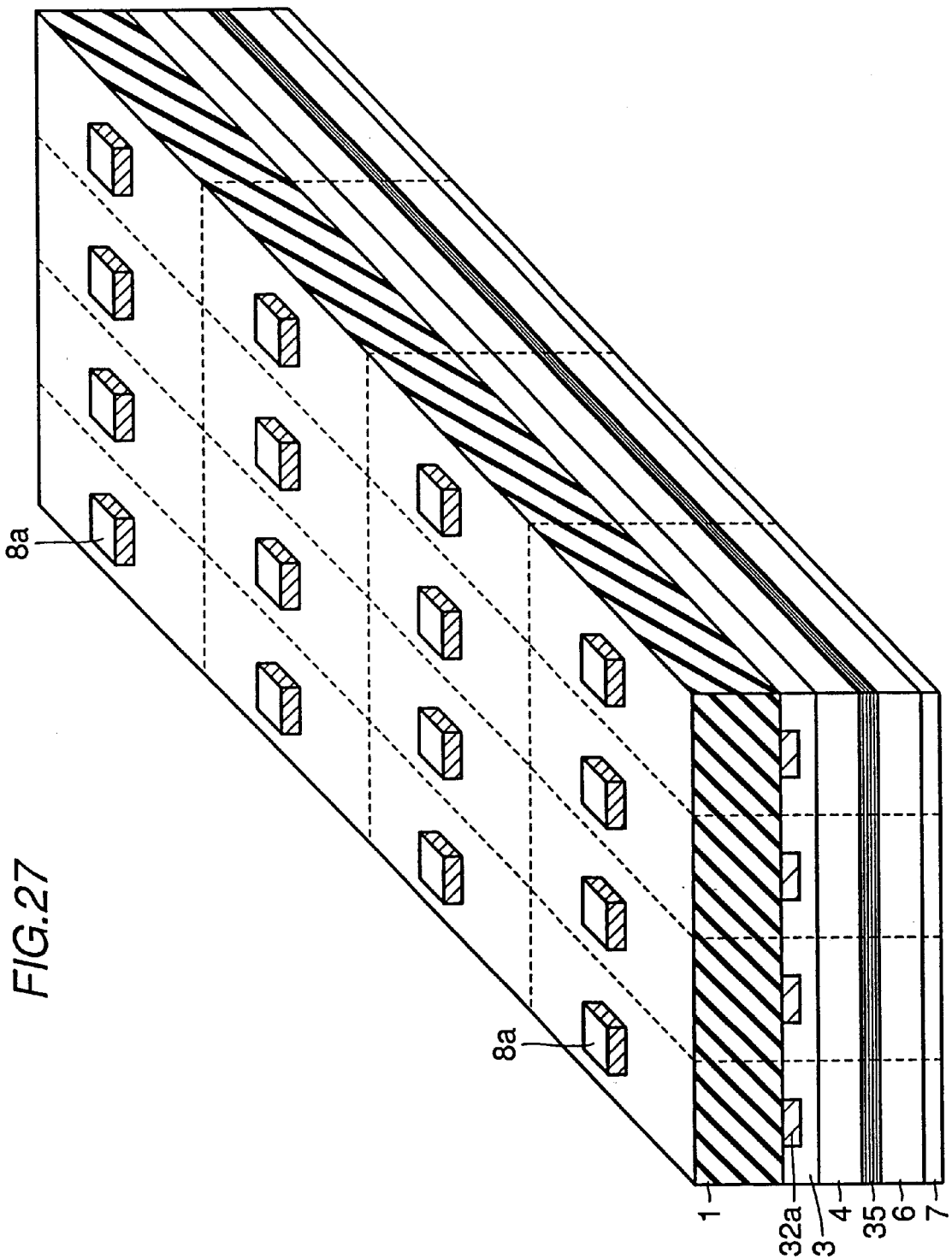

Referring now to FIG. 27, n-type electrode 8a as a lower electrode is formed on a back surface of substrate 1 and in opening 1a such that n-type electrode 8a is in contact with the exposed TiN single crystal thin film 32a according to a method similar to that in the first embodiment.

Figure 28:
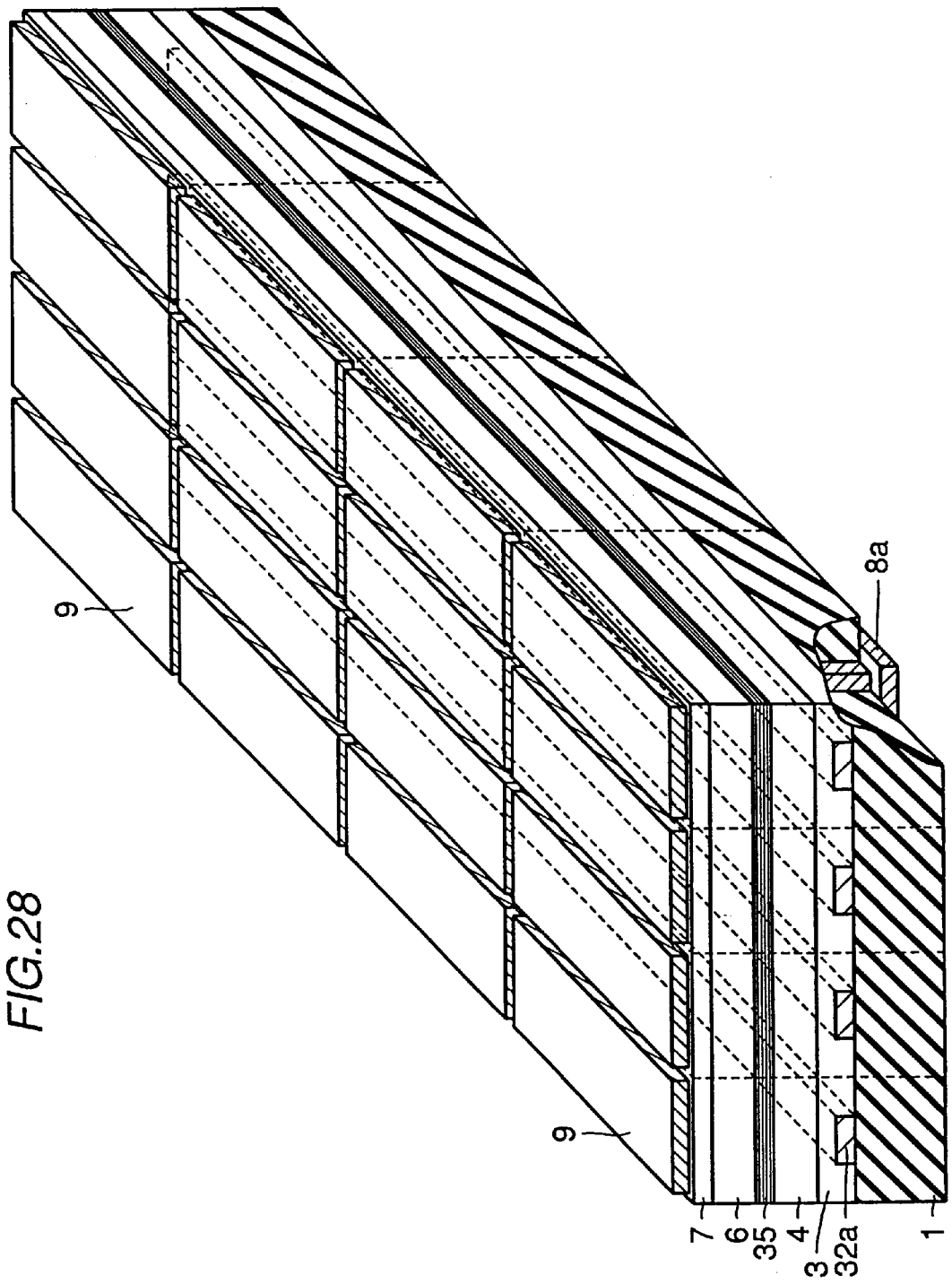

Referring now to FIG. 28, a method similar to that in the first embodiment is then applied to form p-type electrode 9 as an upper electrode on p-type GaN contact layer 7.

Then, cleavage is provided for division into chips to obtain the LD device in FIG. 19.

Since the LD device shown in FIG. 19 has the electrode closer to the substrate formed in stripes, a current narrowing structure can be formed. If a semiconductor close to a substrate is of n-type, as in the FIG. 19 LD device according to the third embodiment, doping concentration can be higher in the n-type semiconductor to reduce the contact resistance between the contact layer and a metal nitride layer and hence the area of the electrode closer to the substrate. The formation of the current narrowing structure at the n-type electrode can increase the area of the p-type electrode and thus reduce the contact resistance between a p-type electrode and a p-type semiconductor layer of lower dopant concentration.

Figure 29:
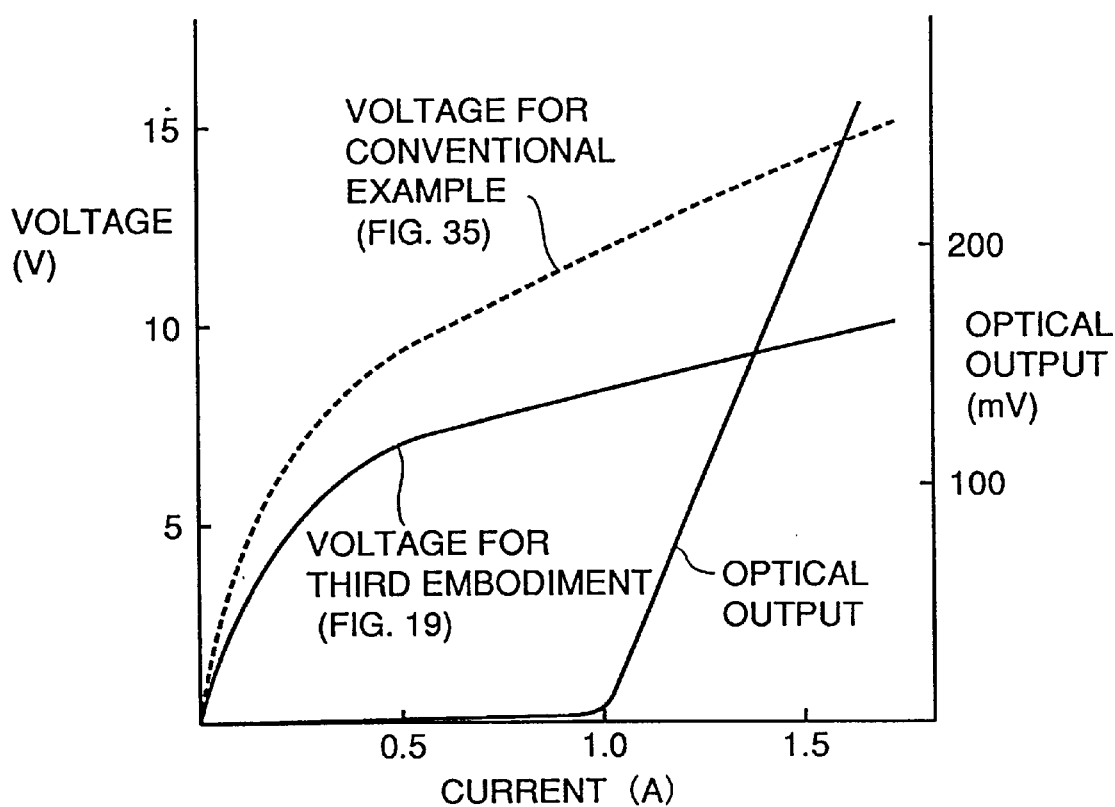
FIG. 29 shows comparisons in current-voltage characteristic and current-optical output characteristic between a conventional LD device and a LD device according to the present invention.

FIG. 29 represents comparisons in current-voltage characteristic and current-optical output characteristic between a conventional LD device and a LD device according to the present invention.

Figure 35:
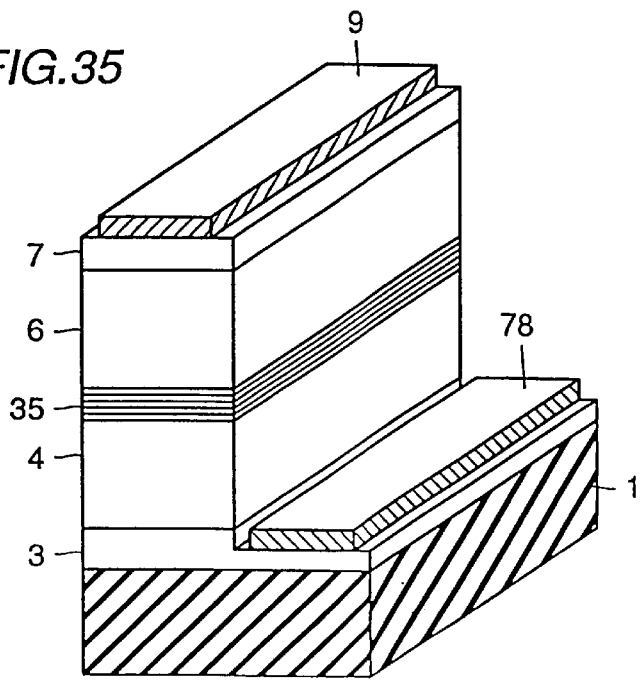
FIG. 35 is a perspective view of a LD device as another example of conventional group III–V type nitride compound semiconductor devices.
Figure 36:
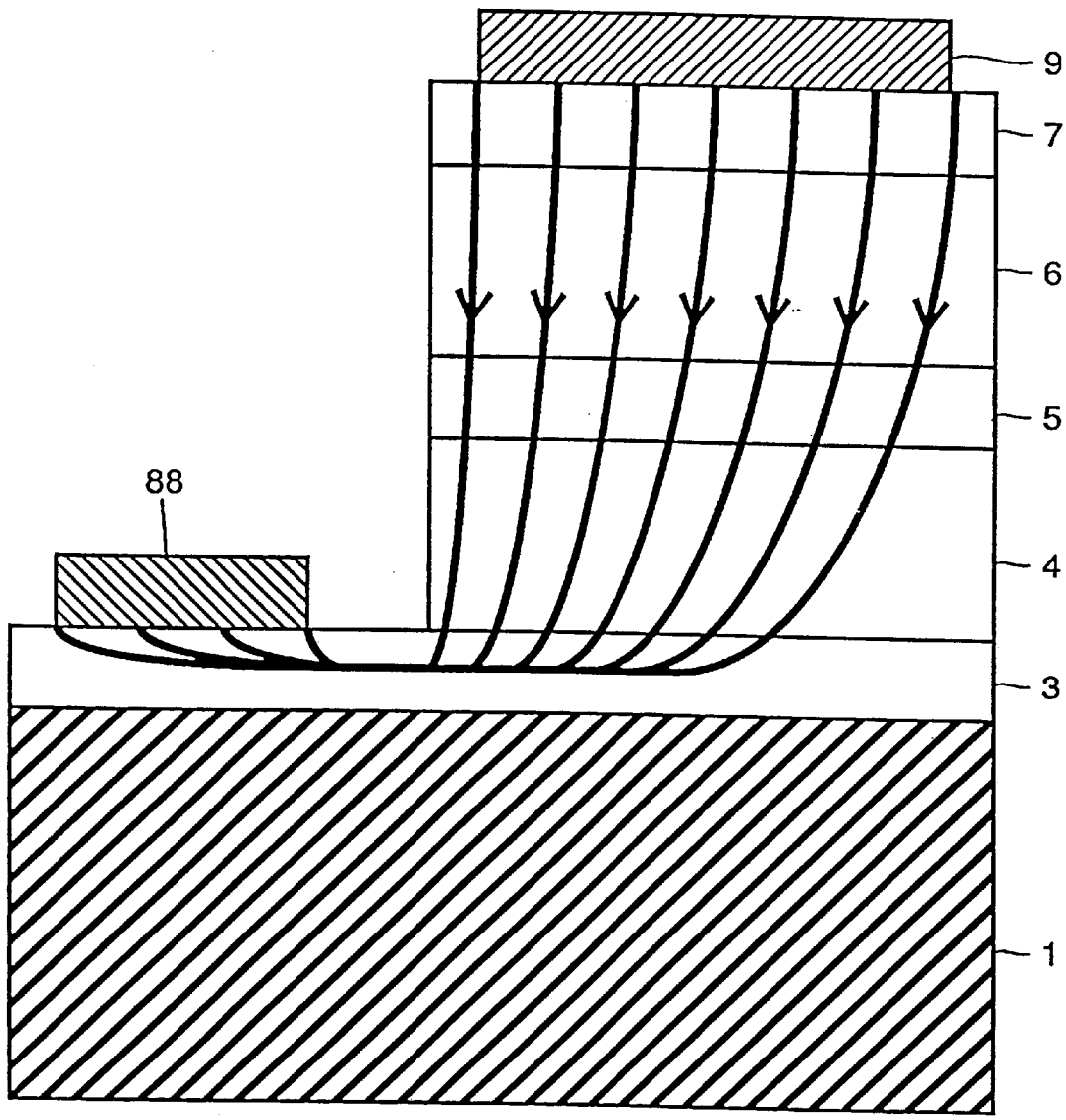
FIG. 36 schematically shows a flow of current passing through a conventional semiconductor device.
Figure 37:
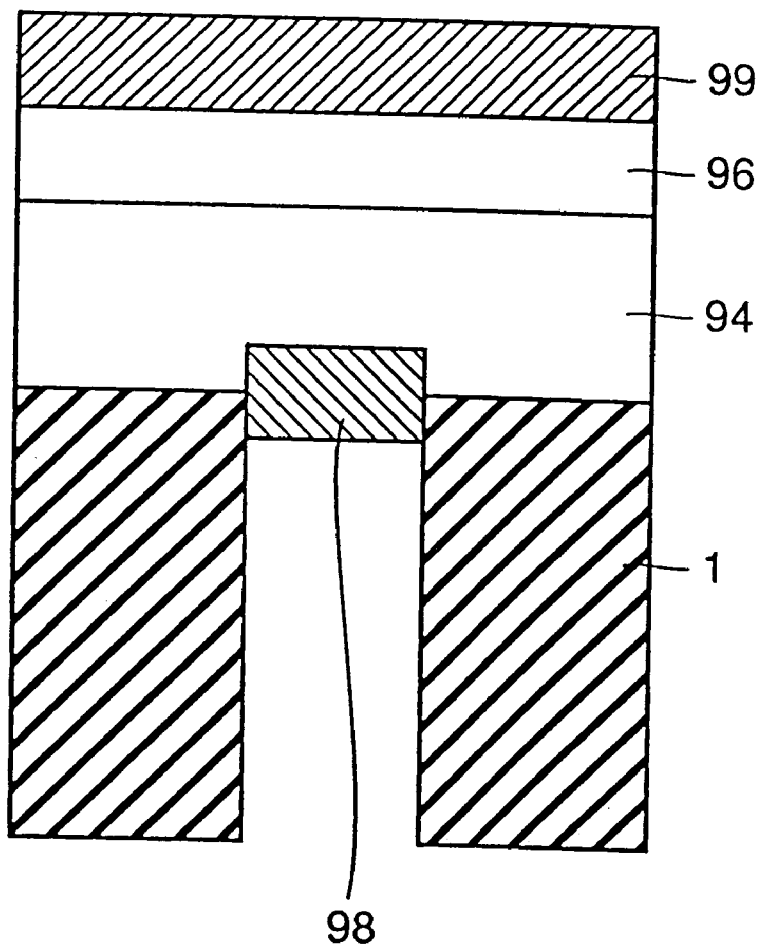
FIG. 37 is a perspective view of a LED device as still another example of conventional group III–V type nitride compound semiconductor devices.

In FIG. 29, the horizontal axis represents current (A) and the vertical axes represent voltage (V) and optical output (mV). The LD device shown in FIG. 19 is applied as the LD device according to the present invention and the LD device shown in FIG. 35 is applied as the conventional LD device. The driving current has a pulse width of 1 μsec, wherein the pulse has a pulse period of 1 msec.

Referring to FIG. 29, it is found that the LD device according to the present invention has an improved optical output characteristic, as compared with the conventional LD device. Furthermore, while oscillation voltage is 12V for the conventional LD device, the present invention can reduce oscillation voltage to 9V.

Figure 30:
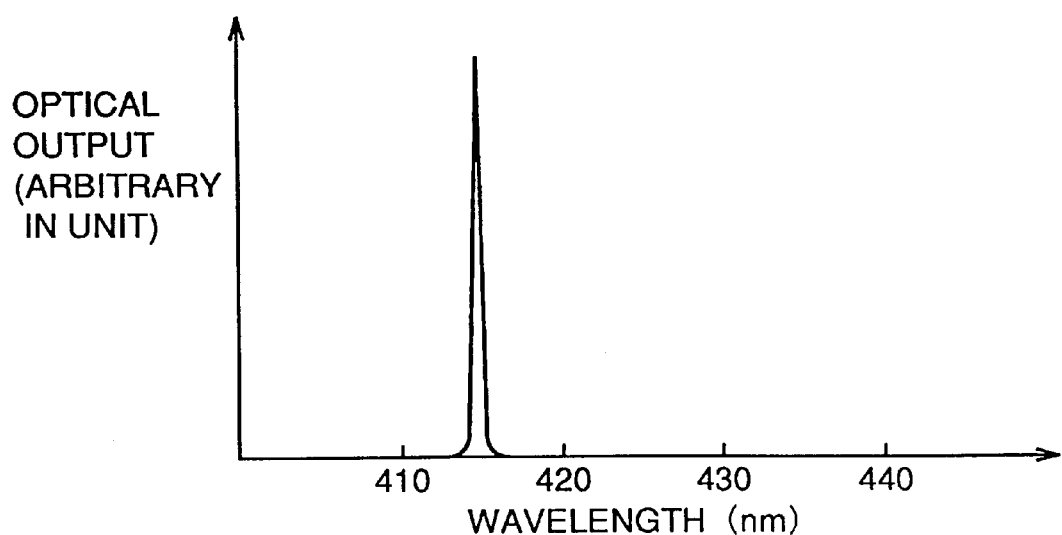
FIG. 30 represents an oscillation spectrum of the FIG. 19 LD device according to the present invention.

FIG. 30 represents an oscillation spectrum of the FIG. 19 LD device according to the present invention. In FIG. 30, the horizontal axis represents wavelength (nm) and the vertical axis represents optical output (arbitrary in unit).

Fourth Embodiment

Figure 31:
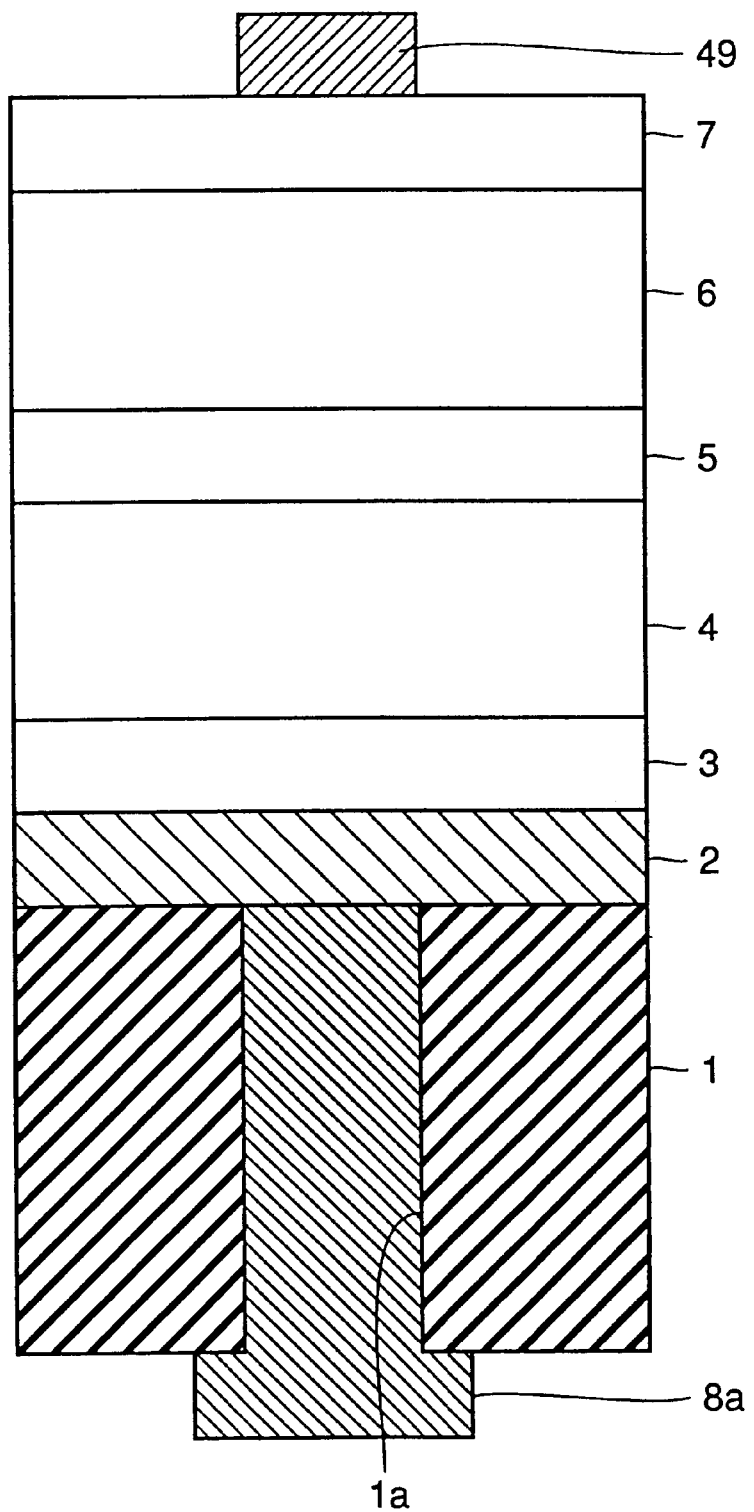
FIG. 31 is a cross section of a structure of a LD device as still another example of the group III–V type nitride compound semiconductor device according to the present invention.

FIG. 31 is a cross sectional structure of a LD device as still another example of the group III–V type nitride compound semiconductor device according to the present invention.

The LD device shown in FIG. 31 includes LiGaO2 substrate 1 with a (100) plane as a main surface, and CrN single crystal thin film 2 (film thickness: 0.5 μm) covering the entire front surface of LiGaO$_2$ substrate 1. Successively formed on CrN single crystal thin film 2 are p-type GaN contact layer 3, p-type AlGaN clad layer 4, InGaN light emitting layer 5, n-type AlGaN clad layer 6 and n-type GaN contact layer 7. Formed on n-type GaN contact layer 7 is an n-type electrode 49 in stripes. LiGaO$_2$ substrate 1 is provided with opening 1a by removing a portion of substrate 1 so that the removal reaches CrN single crystal thin film 2. In opening 1a, p-type electrode 8a is formed in contact with the exposed CrN single crystal thin film 2.

Figure 32:
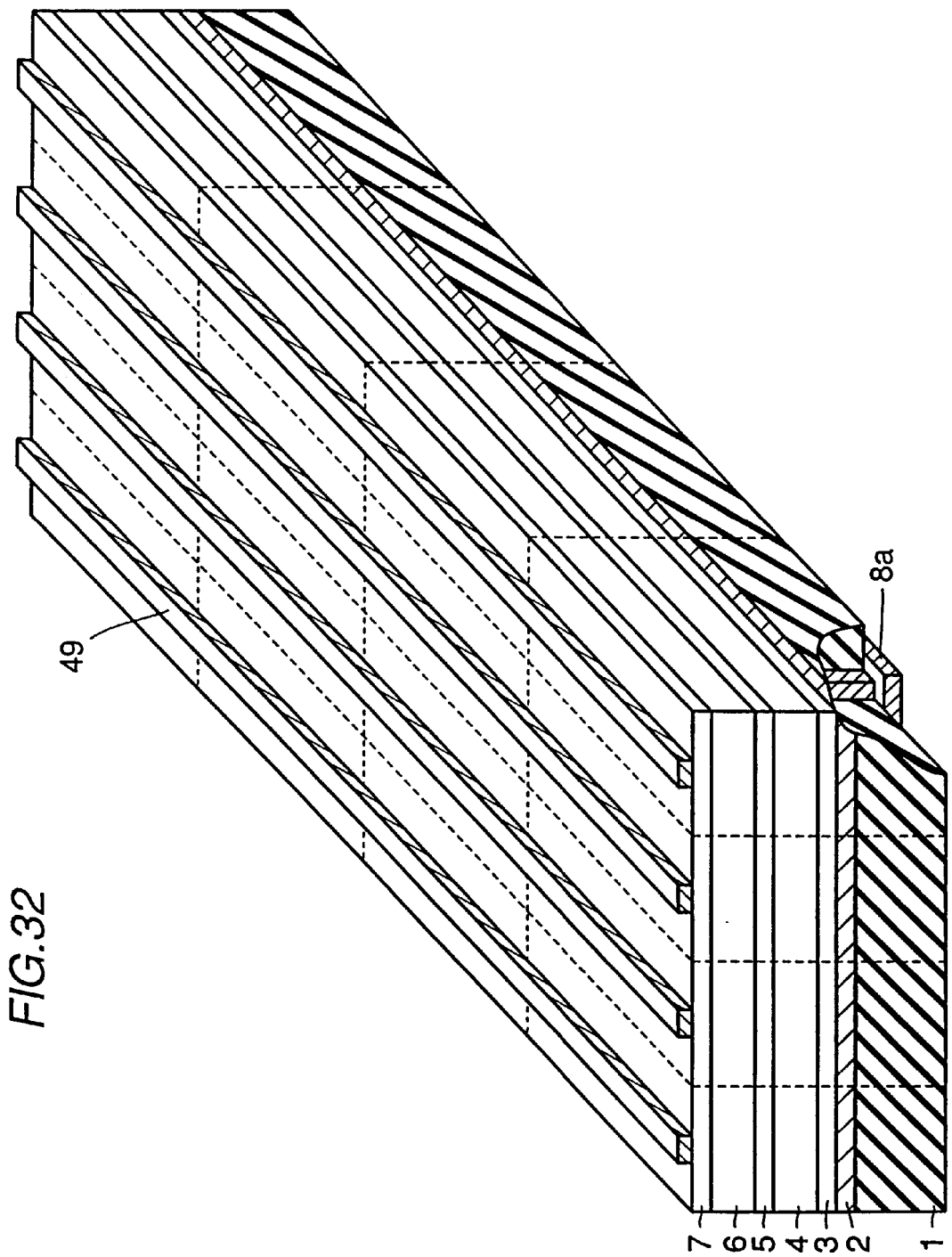
FIG. 32 illustrates a method of manufacturing the LD device shown in FIG. 31.

FIG. 32 illustrates a method of manufacturing the FIG. 31 LD device thus structured.

Referring to FIG. 31, reactive sputtering is applied at a substrate temperature of 750° C. to grow CrN single crystal thin film 2 of 0.5 μm in film thickness on the entire front surface of LiGaO$_2$ substrate 1 with a (100) plane as a main surface. Then, molecular beam epitaxial growth is applied to successively grow p-type GaN contact layer 3, p-type AlGaN clad layer 4, InGaN light emitting layer 5, n-type AlGaN clad layer 6 and n-type GaN contact layer 7 on CrN single crystal thin film 2. Photolithography is then applied to form n-type electrode 49 in stripes as an upper electrode on n-type GaN contact layer 7, as shown in FIG. 32. Opening 1a is then formed in LiGaO$_2$ substrate 1, as in the first embodiment, to form p-type electrode 8a as lower electrode.

Then, cleavage is provided for division into chips, as in the third embodiment, to obtain the LD device shown in FIG. 31.

The FIG. 31 LD device according to the fourth embodiment has that semiconductor closer to the substrate which is of p-type and thus has a structure opposite to that of the FIG. 19 LD device according to the third embodiment. P-type GaN contact layer 3 can be grown on metal nitride layer 2 to increase the area of the p-type electrode, as in the third embodiment, and hence reduce the contact resistance between the p-type electrode and the metal nitride layer.

Fifth Embodiment

Figure 33:
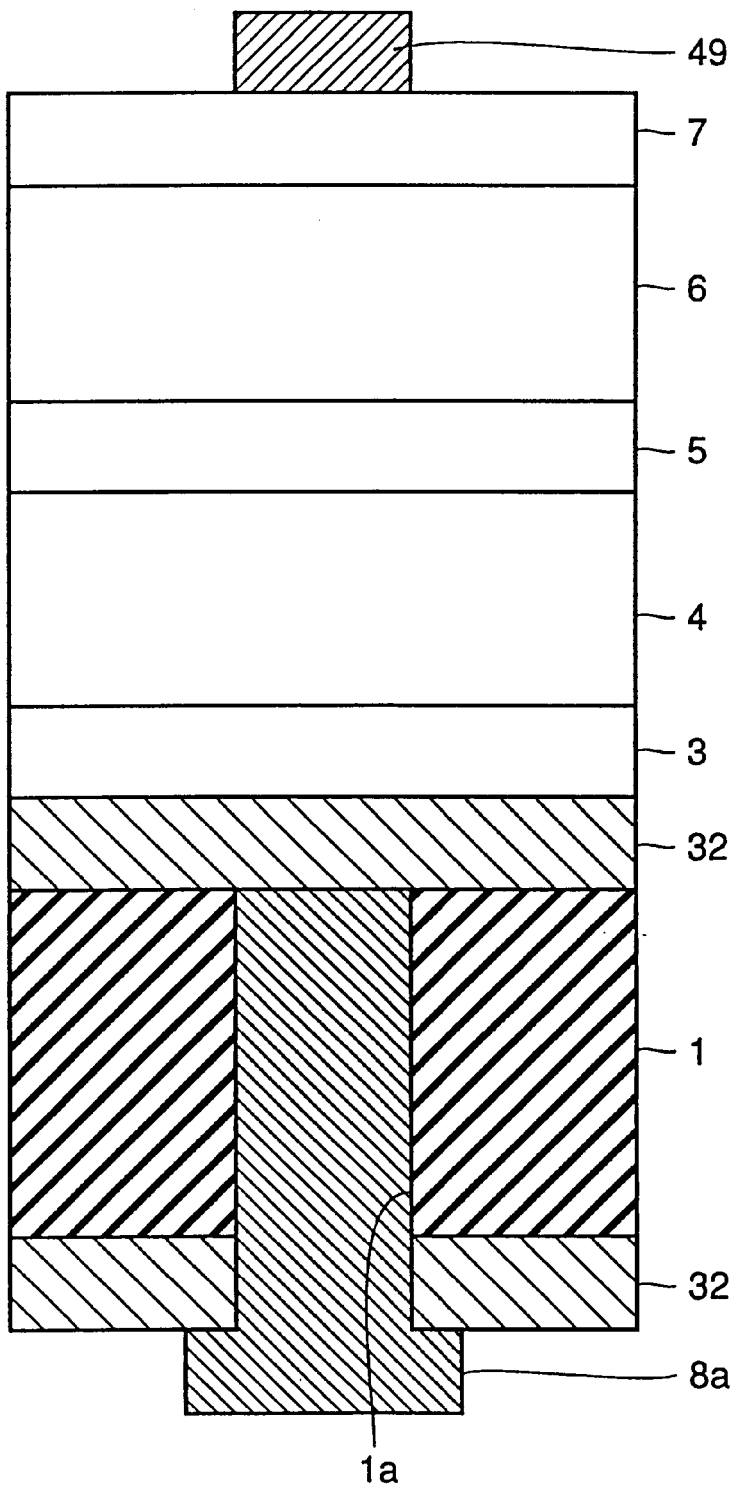
FIG. 33 is a cross section of a structure of a LD device as still another example of the group III–V type nitride compound semiconductor device according to the present invention.

FIG. 33 is a cross section of a structure of a LD device as still another example of the group III–V type nitride compound semiconductor device according to the present invention.

The LD device shown in FIG. 33 includes a MgO substrate 1 with a (111) plane as a main surface, and a NbN single crystal thin film 32 covering the entire front and back surfaces of MgO substrate 1.

The remainder of the structure is identical with that of the FIG. 31 LD device according to the fourth embodiment and a description thereof will not be repeated.

A description of a method of manufacturing the FIG. 33 LD device thus structured will also not be repeated, since the method is identical to that of the fourth embodiment except that NbN single crystal thin film 32 is grown by means of reactive sputtering at a substrate temperature of 800° C.

In manufacturing group III–V type nitride compound semiconductor devices, growing a group III–V type nitride compound semiconductor layer by means of vapor deposition, such as metal organic chemical vapor deposition, requires a substrate material which is stable at high temperature. The substrate material is also required to have cleavage if the device is applied as a LD device. However, a substrate material which satisfies all of such conditions has not yet been discovered. Most of the oxide substrates which have cleavage are of materials the melting points of which are no more than 1000° C. and thus it is conventionally difficult to grow a nitride-based compound semiconductor layer thereon. However, a metal nitride layer covering the front and back surfaces of a substrate, as in the present invention, allows a substrate material with low melting point to be used to grow a semiconductor layer thereon by metal organic chemical vapor deposition or the like.

While the metal nitride layer in the above embodiments is of TiN, CrN, NbN, the metal nitride layer may be of e.g. CeN, DyN, ErN, EuN, GdN, HoN, LaN, LuN, NdN, PrN, PuN, ScN, SmN, TbN, ThN, TmN, UN, VN, YN, YbN, ZrN to obtain an effect similar to those in the above embodiments.

While the materials for the insulating substrate of the above embodiments are MgO, LiAlO$_2$, LiGaO$_2$, the materials may be e.g. ZnO, LiMgO$_3$, Al$_2$O$_3$ to obtain an effect similar to those in the above embodiments.

Thus, the present invention can increase the area of an electrode closer to the substrate without degrading the mechanical strength of the substrate, and thus reduce the operating voltage of the semiconductor device.

Formation of an electrode in stripes closer to the substrate can facilitate formation of current strict structure if the device is applied as a LD device.

Since most of metal nitrides are materials with high melting point and oxide substrate materials generally have low melting points, coating the periphery of an oxide substrate material with metal nitride layer can restrict decomposition of the substrate material during vapor growth and thus allows many oxide substrate materials to be used for vapor deposition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A group III–V type nitride compound semiconductor device comprising:
   an insulating substrate including an opening at a portion thereof;
   a metal nitride layer having a conductivity, formed on a first surface of said insulating substrate;
   a group III–V type nitride compound semiconductor layer formed on said metal nitride layer;
   a first electrode formed at said opening and coming in contact with said metal nitride layer; and
   a second electrode formed on said group III–V type nitride compound semiconductor layer wherein said metal nitride layer contains at least one of nitrides of any element of any of the groups 3A, 4A, 5A and 6A in the periodic table.

2. The group III–V type nitride compound semiconductor device according to claim 1, wherein said metal nitride layer contains at least one material selected from the group consisting of CeN, CrN, DyN, ErN, EuN, GdN, HoN, LaN, LuN, NbN, NdN, PrN, PuN, ScN, SmN, TbN, ThN, TiN, TmN, UN, VN, YN, YbN and ZrN.

3. The group III–V type nitride compound semiconductor device according to claim 1, wherein said insulating substrate contains at least one oxide material selected from the group consisting of MgO, LiGaO$_2$, LiAlO$_2$, ZnO, LiMgO$_3$ and Al$_2$O$_3$.

4. The group III–V type nitride compound semiconductor device according to claim 1, wherein said group III–V type nitride compound semiconductor layer includes:
   a first contact layer having a first conductivity, formed on said metal nitride layer;
   a first clad layer having the first conductivity, formed on said first contact layer;
   a light emitting layer formed on said first clad layer;
   a second clad layer having a second conductivity, formed on said light emitting layer;
   a second contact layer having the second conductivity formed on said second clad layer.

5. The group III–V type nitride compound semiconductor device according to claim 4, which comprises a light emitting diode device, wherein said metal nitride layer is formed to cover an entirety of said first surface of said insulating substrate.

6. The group III–V type nitride compound semiconductor device according to claim 5, further comprising a second metal nitride layer covering an entirety of a second surface of said insulating substrate.

7. The group III–V type nitride compound semiconductor device according to claim 4, which comprises a laser diode device, wherein:

said metal nitride layer is formed at a predetermined portion on said first surface of said insulating substrate; and a contact resistance between said first contact layer and said metal nitride layer is smaller than a contact resistance between said second contact layer and said second electrode.

8. The group III–V type nitride compound semiconductor device according to claim 7, wherein the first conductivity is n-type.

9. The group III–V type nitride compound semiconductor device according to claim 4, as a laser diode device, wherein:

said metal nitride layer is formed to cover an entirety of said first surface of said insulating substrate;

said second electrode is formed at a predetermined portion on said second contact layer; and a contact resistance between said second contact layer and said second electrode is smaller than a contact resistance between said first contact layer and said metal nitride layer.

10. The group III–V type nitride compound semiconductor device according to claim 9, further comprising a second metal nitride layer covering an entirety of a second surface of said insulating substrate.

11. The group III–V type nitride compound semiconductor device according to claim 9, wherein the first conductivity is p-type.

* * * * *

UNITED STATES PATENT AND TRADEMARK OFFICE
CERTIFICATE OF CORRECTION

PATENT NO. : 6,201,265 B1
DATED : March 13, 2001
INVENTOR(S) : Nobuaki Teraguchi It is certified that error appears in the above-identified patent and that said Letters Patent is hereby corrected as shown below:

<u>Title page,</u>
Title, please delete" AND METHOD OF MANUFACTURING THE SAME" and substitute therefor -- HAVING A CONTACT THROUGH AN INSULATING SUBSTRATE --.

Signed and Sealed this

Twelfth Day of February, 2002

Attest:

JAMES E. ROGAN
Attesting Officer    Director of the United States Patent and Trademark Office